(12) United States Patent
Watanabe et al.

(10) Patent No.: US 7,591,863 B2
(45) Date of Patent: Sep. 22, 2009

(54) LAMINATING SYSTEM, IC SHEET, ROLL OF IC SHEET, AND METHOD FOR MANUFACTURING IC CHIP

(75) Inventors: Ryosuke Watanabe, Isehara (JP); Hidekazu Takahashi, Isehara (JP); Takuya Tsurume, Atsugi (JP); Yasuyuki Arai, Atsugi (JP); Yasuko Watanabe, Atsugi (JP); Miyuki Higuchi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/168,353

(22) Filed: Jun. 29, 2005

(65) Prior Publication Data

US 2006/0011288 A1 Jan. 19, 2006

(30) Foreign Application Priority Data

Jul. 16, 2004 (JP) ............... 2004-210620

(51) Int. Cl.
*H01L 21/00* (2006.01)
*H01L 21/64* (2006.01)

(52) U.S. Cl. .......... 29/25.01; 438/99; 438/127; 438/761; 438/780; 257/E21.598

(58) Field of Classification Search .......... 425/516; 156/498, 500, 501, 580, 582, 583.1, 552, 156/555, 301, 244.11, 230, 308, 235, 308.4, 156/522, 443, 224.11; 428/106; 438/106, 438/115, 127, 761, 778, 780, 800, FOR. 135, 438/FOR. 370, FOR. 395; 29/25.01; 257/E21.598
See application file for complete search history.

(56) References Cited

U.S. PATENT DOCUMENTS

| 4,591,848 A | 5/1986 | Morozumi et al. |
| 4,743,334 A * | 5/1988 | Singer .................. 156/499 |
| 4,897,662 A | 1/1990 | Lee et al. |

(Continued)

FOREIGN PATENT DOCUMENTS

| EP | 0866494 | 9/1998 |
| EP | 1435653 | 7/2004 |
| EP | 1437683 | 7/2004 |
| EP | 1455394 | 9/2004 |
| JP | 06-021443 | 1/1994 |

(Continued)

OTHER PUBLICATIONS

Office Action (Application No. 200510084624.7) Dated Mar. 21, 2008.
International Search Report (Application No. PCT/JP2005/010313) Dated Sep. 6, 2005.
Written Opinion (Application No. PCT/JP2005/010313) Dated Sep. 6, 2005.

*Primary Examiner*—Michelle Estrada
*Assistant Examiner*—Quovaunda Jefferson
(74) *Attorney, Agent, or Firm*—Eric J. Robinson; Robinson Intellectual Property Law Office, P.C.

(57) ABSTRACT

The invention provides a laminating system in which one of second and third substrates for sealing a thin film integrated circuit is supplied to a first substrate having the plurality of thin film integrated circuit while being extruded in a heated and melted state, and further rollers are used for supplying the other substrate, receiving IC chips, separating, and sealing. Processes of separating the thin film integrated circuits provided over the first substrate, sealing the separated thin film integrated circuits, and receiving the sealed thin film integrated circuits can be continuously carried out by rotating the rollers. Thus, the production efficiency can be extremely improved.

25 Claims, 13 Drawing Sheets

U.S. PATENT DOCUMENTS

| | | | |
|---|---|---|---|
| 5,132,819 A | 7/1992 | Noriyama et al. | |
| 5,203,941 A * | 4/1993 | Spain et al. | 156/209 |
| 5,457,474 A | 10/1995 | Ikeda | |
| 5,461,338 A | 10/1995 | Hirayama et al. | |
| 5,477,073 A | 12/1995 | Wakai et al. | |
| 5,552,637 A | 9/1996 | Yamagata | |
| 5,644,147 A | 7/1997 | Yamazaki et al. | |
| 5,652,029 A | 7/1997 | Itoh | |
| 5,757,456 A | 5/1998 | Yamazaki et al. | |
| 5,766,696 A | 6/1998 | Itoh | |
| 5,807,772 A | 9/1998 | Takemura | |
| 5,814,834 A | 9/1998 | Yamazaki et al. | |
| 5,818,070 A | 10/1998 | Yamazaki et al. | |
| 5,821,137 A | 10/1998 | Wakai et al. | |
| 5,834,797 A | 11/1998 | Yamanaka | |
| 5,917,221 A | 6/1999 | Takemura | |
| 5,929,961 A | 7/1999 | Nishi et al. | |
| 5,956,011 A | 9/1999 | Koyama et al. | |
| 6,010,923 A | 1/2000 | Jinno | |
| 6,037,924 A | 3/2000 | Koyama et al. | |
| 6,072,193 A | 6/2000 | Ohnuma et al. | |
| 6,081,131 A | 6/2000 | Ishii | |
| 6,118,502 A | 9/2000 | Yamazaki et al. | |
| 6,150,283 A | 11/2000 | Ishiguro | |
| 6,153,893 A | 11/2000 | Inoue et al. | |
| 6,197,624 B1 | 3/2001 | Yamazaki | |
| 6,198,133 B1 | 3/2001 | Yamazaki et al. | |
| 6,204,519 B1 | 3/2001 | Yamazaki et al. | |
| 6,207,971 B1 | 3/2001 | Jinno et al. | |
| 6,285,248 B1 | 9/2001 | Hiratsuka | |
| 6,320,640 B2 | 11/2001 | Nishi et al. | |
| 6,342,434 B1 | 1/2002 | Miyamoto et al. | |
| 6,342,717 B1 | 1/2002 | Komatsu | |
| 6,388,509 B2 | 5/2002 | Hiratsuka | |
| 6,392,628 B1 | 5/2002 | Yamazaki et al. | |
| 6,447,448 B1 | 9/2002 | Ishikawa et al. | |
| 6,462,723 B1 | 10/2002 | Yamazaki et al. | |
| 6,512,271 B1 | 1/2003 | Yamazaki et al. | |
| 6,569,716 B1 | 5/2003 | Suzuki | |
| 6,573,158 B2 | 6/2003 | Miyamoto et al. | |
| 6,589,855 B2 | 7/2003 | Miyamoto et al. | |
| 6,603,453 B2 | 8/2003 | Yamazaki et al. | |
| 6,608,613 B2 | 8/2003 | Koyama et al. | |
| 6,620,288 B2 | 9/2003 | Shinohara et al. | |
| 6,839,123 B2 | 1/2005 | Nishi et al. | |
| 6,842,396 B2 | 1/2005 | Kono | |
| 6,887,650 B2 | 5/2005 | Shimoda et al. | |
| 6,922,134 B1 | 7/2005 | Yones | |
| 6,990,572 B2 | 1/2006 | Ando | |
| 7,015,080 B2 | 3/2006 | Ishikawa | |
| 7,037,752 B2 | 5/2006 | Kuwabara et al. | |
| 7,045,442 B2 | 5/2006 | Maruyama et al. | |
| 7,050,138 B1 | 5/2006 | Yamazaki et al. | |
| 7,060,153 B2 | 6/2006 | Yamazaki et al. | |
| 7,169,636 B2 | 1/2007 | Maruyama et al. | |
| 7,176,069 B2 | 2/2007 | Yamazaki et al. | |
| 2001/0015256 A1 | 8/2001 | Yamazaki et al. | |
| 2001/0038308 A1 | 11/2001 | Hiratsuka | |
| 2002/0034860 A1 | 3/2002 | Miyamoto et al. | |
| 2002/0048907 A1 | 4/2002 | Miyamoto et al. | |
| 2003/0022403 A1 | 1/2003 | Shimoda et al. | |
| 2003/0104659 A1 | 6/2003 | Arakawa et al. | |
| 2003/0162312 A1 | 8/2003 | Takayama et al. | |
| 2003/0188831 A1 * | 10/2003 | Sasaki et al. | 156/510 |
| 2004/0063256 A1 | 4/2004 | Ishikawa | |
| 2004/0129450 A1 | 7/2004 | Yamazaki et al. | |
| 2004/0129960 A1 | 7/2004 | Maruyama et al. | |
| 2004/0207011 A1 | 10/2004 | Iwata et al. | |
| 2004/0233374 A1 | 11/2004 | Yamazaki et al. | |
| 2004/0238827 A1 | 12/2004 | Takayama et al. | |
| 2004/0239827 A1 | 12/2004 | Yamazaki et al. | |
| 2005/0023530 A1 | 2/2005 | Koyama | |
| 2005/0051870 A1 | 3/2005 | Yamazaki et al. | |
| 2005/0056842 A1 | 3/2005 | Nishi et al. | |
| 2005/0070038 A1 | 3/2005 | Yamazaki et al. | |
| 2005/0090075 A1 | 4/2005 | Takayama et al. | |
| 2005/0105039 A1 | 5/2005 | Nishi et al. | |
| 2005/0112805 A1 | 5/2005 | Goto et al. | |
| 2005/0139823 A1 | 6/2005 | Hirakata et al. | |
| 2005/0158929 A1 | 7/2005 | Yamazaki et al. | |
| 2005/0167573 A1 | 8/2005 | Maruyama et al. | |
| 2005/0285231 A1 | 12/2005 | Arao et al. | |
| 2005/0287846 A1 | 12/2005 | Dozen et al. | |
| 2006/0189097 A1 | 8/2006 | Maruyama et al. | |
| 2008/0042168 A1 * | 2/2008 | Watanabe et al. | 257/204 |
| 2008/0044940 A1 * | 2/2008 | Watanabe et al. | 438/64 |
| 2008/0093464 A1 | 4/2008 | Dairiki et al. | |
| 2008/0231354 A1 | 9/2008 | Koyama | |

FOREIGN PATENT DOCUMENTS

| | | | |
|---|---|---|---|
| JP | 07-074282 | 3/1995 | |
| JP | 08-254686 | 10/1996 | |
| JP | 2000-252470 | 9/2000 | |
| JP | 2001-277726 | 10/2001 | |
| JP | 2002-041160 | 2/2002 | |
| JP | 2003-016405 | 1/2003 | |
| JP | 2003-086706 | 3/2003 | |
| JP | 2003-203898 | 7/2003 | |
| JP | 2004-094492 | * | 3/2004 |
| JP | 2004-118255 | 4/2004 | |
| JP | 2004-221570 | 8/2004 | |
| JP | 2003-016405 | 1/2005 | |
| WO | WO-1999/026290 | 5/1999 | |
| WO | WO 2005/119781 | 12/2005 | |

* cited by examiner

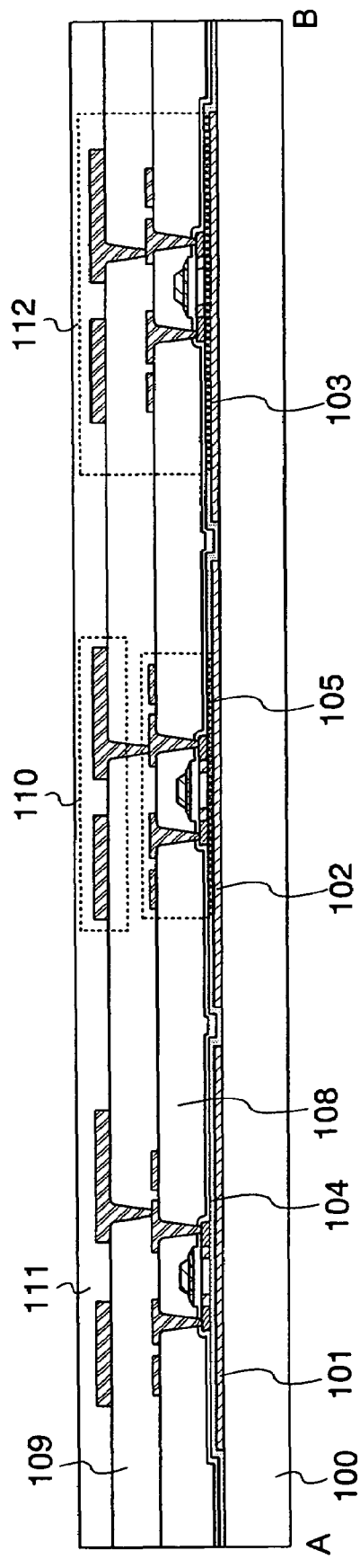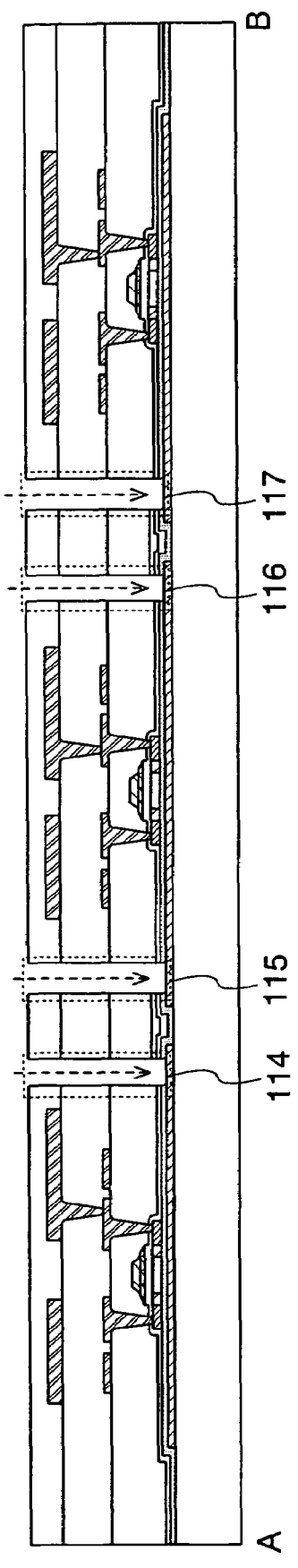

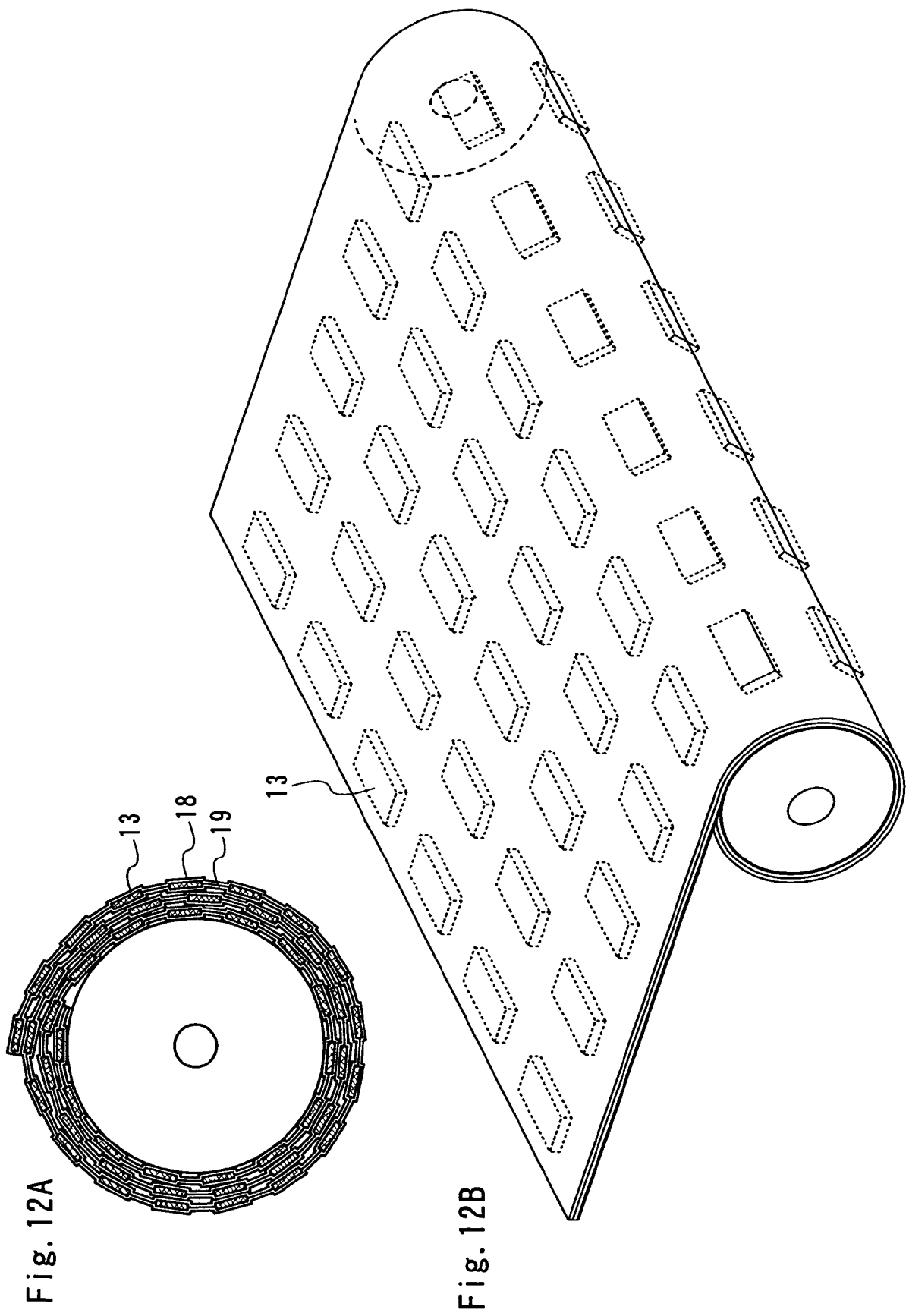

LAMINATING SYSTEM, IC SHEET, ROLL OF IC SHEET, AND METHOD FOR MANUFACTURING IC CHIP

BACKGROUND OF THE INVENTION

1. Field of the Invention

The present invention relates to a laminating system which seals a thin film integrated circuit. The invention also relates to an IC sheet including a plurality of thin film integrated circuits which are sealed. The invention further relates to a wound roll of an IC sheet including a plurality of thin film integrated circuits which are sealed. The invention still further relates to a method for manufacturing an IC chip in which a thin film integrated circuit is sealed.

2. Description of the Related Art

In recent years, a technology of an IC chip (also referred to as an IC tag, an ID tag, an RF (Radio Frequency) tag, a wireless tag, an electronic tag, a wireless memory, or electronic memory) using a thin film integrated circuit provided over a glass substrate has been developed. In such a technology, a thin film integrated circuit provided over a glass substrate is required to be separated from the glass substrate, which is a supporting substrate, after the completion.

Accordingly, as a technology for separating a thin film integrated circuit provided over a supporting substrate from the supporting substrate, for example, there is a technology in which a separation layer containing silicon is provided between a thin film integrated circuit and a supporting substrate and the separation layer is removed with the use of a gas containing halogen fluoride, thereby separating the thin film integrated circuit from the supporting substrate (Reference 1: Japanese Patent Laid-Open No. 8-254686).

SUMMARY OF THE INVENTION

A plurality of thin film integrated circuits is provided over a glass substrate, and the plurality of thin film integrated circuits is separated individually while the separation layer is removed. However, the production efficiency is low in the case of sealing the separated thin film integrated circuits individually. Further, a thin film integrated circuit is so fragile since it is thin and lightweight that it is extremely difficult to seal the thin film integrated circuit without damage or break. In view of the above problem, it is an object of the invention to improve the production efficiency in sealing a thin film integrated circuit and to prevent damage and break.

Further, as described above, a thin film integrated circuit is very fragile, and attention is required to handle it even after a sealing step; therefore, it has been very difficult to ship it without damage and break. Accordingly, it is another object of the invention to prevent a thin film integrated circuit from being damaged and broken in shipment and to make the thin film integrated circuit easier to handle.

The present invention provides a laminating system in which one of second and third substrates for sealing a thin film integrated circuit is supplied while being extruded in a heated and melted state and rollers are used for supplying the other substrate, receiving IC chips, separating, and sealing. Processes of separating a plurality of thin film integrated circuits provided over a first substrate, sealing the separated thin film integrated circuits, and receiving the sealed thin film integrated circuits can be continuously carried out by rotating the rollers; thus, the production efficiency can be extremely improved. Further, the thin film integrated circuits can be sealed easily since a pair of rollers opposite to each other is used.

A first structure of a laminating system according to the invention includes a transfer means which transfers a first substrate provided with a plurality of thin film integrated circuits, a means for supplying a thermoplastic resin over the first substrate provided with the plurality of thin film integrated circuits while being extruded in a heated and melted state, a roller having a cooling means, which attaches one surface of the thin film integrated circuits to a second substrate formed from the thermoplastic resin and separates the thin film integrated circuits from the first substrate by cooling the thermoplastic resin supplied in a heated and melted state, a supplying roller wound with a third substrate, a means for sealing the thin film integrated circuits separated from the first substrate between the second substrate and the third substrate, and a receiving roller to be wound with the sealed thin film integrated circuits.

A second structure of a laminating system according to the invention includes a means for supplying a thermoplastic resin over a first substrate provided with a plurality of thin film integrated circuits while being extruded in a heated and melted state, a roller having a cooling means, which attaches one surface of the thin film integrated circuits to a second substrate formed from the thermoplastic resin and separates the thin film integrated circuits from the first substrate by cooling the thermoplastic resin supplied in a heated and melted state, a supplying roller wound with a third substrate, a means for sealing the thin film integrated circuits separated from the first substrate between the second substrate and the third substrate, and a receiving roller to be wound with the sealed thin film integrated circuits.

A third structure of a laminating system according to the invention includes a transfer means which transfers a first substrate provided with a plurality of thin film integrated circuits, a means for supplying a thermoplastic resin over the first substrate provided with the plurality of thin film integrated circuits while being extruded in a heated and melted state, a supplying roller wound with a third substrate, a means for attaching one surface of the thin film integrated circuits to a second substrate formed from the thermoplastic resin and separating the thin film integrated circuits from the first substrate by cooling the thermoplastic resin supplied in a heated and melted state and for sealing the thin film integrated circuits separated from the first substrate between the second substrate and the third substrate, and a receiving roller to be wound with the sealed thin film integrated circuits.

A fourth structure of a laminating system according to the invention includes a first substrate provided with a plurality of thin film integrated circuits, a supplying roller wound with a second substrate, a transfer means which transfers the second substrate, a moving means which places the first substrate above the second substrate so that one surface of the thin film integrated circuits provided over the first substrate is attached to the second substrate, a separating means which attaches the one surface of the thin film integrated circuits to the second substrate and separates the thin film integrated circuits from the first substrate, a means for supplying a thermoplastic resin in a heated and melted state, a means for sealing the thin film integrated circuits separated from the first substrate between the second substrate and a third substrate formed from the thermoplastic resin, and a receiving roller to be wound with the sealed thin film integrated circuits.

In a laminating system having any one of the first to fourth structures, the means for sealing the thin film integrated circuits between the second substrate and the third substrate includes a first roller and a second roller which are opposed to each other.

In a laminating system having any one of the first to third structures, the means for sealing the thin film integrated circuits between the second substrate and the third substrate includes a first roller and a second roller which are opposed to each other, and one of the first roller and the second roller has a heating means.

In a laminating system having the third or fourth structure, the means for sealing the thin film integrated circuits between the second substrate and the third substrate includes a first roller and a second roller which are opposed to each other, and one of the first roller and the second roller has a cooling means.

In a laminating system having the third structure, the means for sealing the thin film integrated circuits between the second substrate and the third substrate includes a first roller and a second roller which are opposed to each other, and one of the first roller and the second roller has a cooling means and the other has a heating means.

In a laminating system having the first or second structure, the means for sealing the thin film integrated circuits between the second substrate and the third substrate seals the thin film integrated circuits by performing either or both of pressure treatment and heat treatment while the thin film integrated circuits pass between the first roller and the second roller which are opposed to each other.

In a laminating system having the fourth structure, the means for sealing the thin film integrated circuits between the second substrate and the third substrate seals the thin film integrated circuits by performing pressure treatment and heat treatment while the thin film integrated circuits pass between the first roller and the second roller which are opposed to each other.

In a laminating system having any one of the first to third structures, the third substrate is a laminate film.

In a laminating system having the fourth structure, the second substrate is a laminate film.

Further, the invention provides an IC sheet which is a sealed thin film integrated circuit that is made to have a sheet-like shape to be handled easily. An IC sheet according to the invention has a plurality of thin film integrated circuits, a first substrate, and a second substrate, and has a structure in which each of the plurality of thin film integrated circuits is sealed on both surfaces between the first substrate and the second substrate.

Moreover, the invention provides a roll of an IC sheet including a plurality of thin film integrated circuits sealed between a first substrate and a second substrate, which is wound to be handled easily. A roll of an IC sheet according to the invention is a roll of an IC sheet obtained by sealing each of the plurality of thin film integrated circuits on both surfaces between a first substrate and a second substrate.

As to the IC sheet or the roll of an IC sheet having the above structure, each of the plurality of thin film integrated circuits has a plurality of thin film transistors and a conductive layer which serves as an antenna. The plurality of thin film integrated circuits is arranged regularly. Further, the first substrate or the second substrate is a laminate film.

A method for manufacturing an IC chip according to the invention includes the steps of forming a separation layer over a first substrate having an insulating surface, forming a plurality of thin film integrated circuits over the first substrate, forming an opening at a boundary between the thin film integrated circuits to expose the separation layer, introducing a gas or a liquid containing halogen fluoride into the opening to remove the separation layer, attaching one surface of the thin film integrated circuits to a second substrate to separate the thin film integrated circuits from the first substrate, attaching the other surface of the thin film integrated circuits to a third substrate to seal the thin film integrated circuits between the second substrate and the third substrate. Further, a plurality of thin film transistors and a conductive layer serving as an antenna are formed as the thin film integrated circuit over the first substrate.

A laminating system according to the invention which uses a roller wound with a substrate, a roller to be wound with thin film integrated circuits, and rollers for separating and sealing the thin film integrated circuits can continuously carry out processes of separating a plurality of thin film integrated circuits provided over a substrate, sealing the separated thin film integrated circuits, and receiving the sealed thin film integrated circuits. Thus, the production efficiency can be improved and the manufacturing time can be reduced. Further, a laminating system according to the invention which seals thin film integrated circuits using a pair of rollers opposite to each other as a laminating means can easily seal the thin film integrated circuits.

As to an IC sheet and a roll of an IC sheet according to the invention, thin film integrated circuits are already sealed; thus, they can be easily handled and the thin film integrated circuits can be prevented from being damaged and broken. Further, a great amount of thin film integrated circuits can be easily shipped.

BRIEF DESCRIPTION OF DRAWINGS

FIGS. 5A and 5B are figures showing a method for manufacturing an IC chip.

FIGS. 12A and 12B are figures showing a roll of an IC sheet according to the invention.

DETAILED DESCRIPTION OF THE INVENTION

Figure 1:
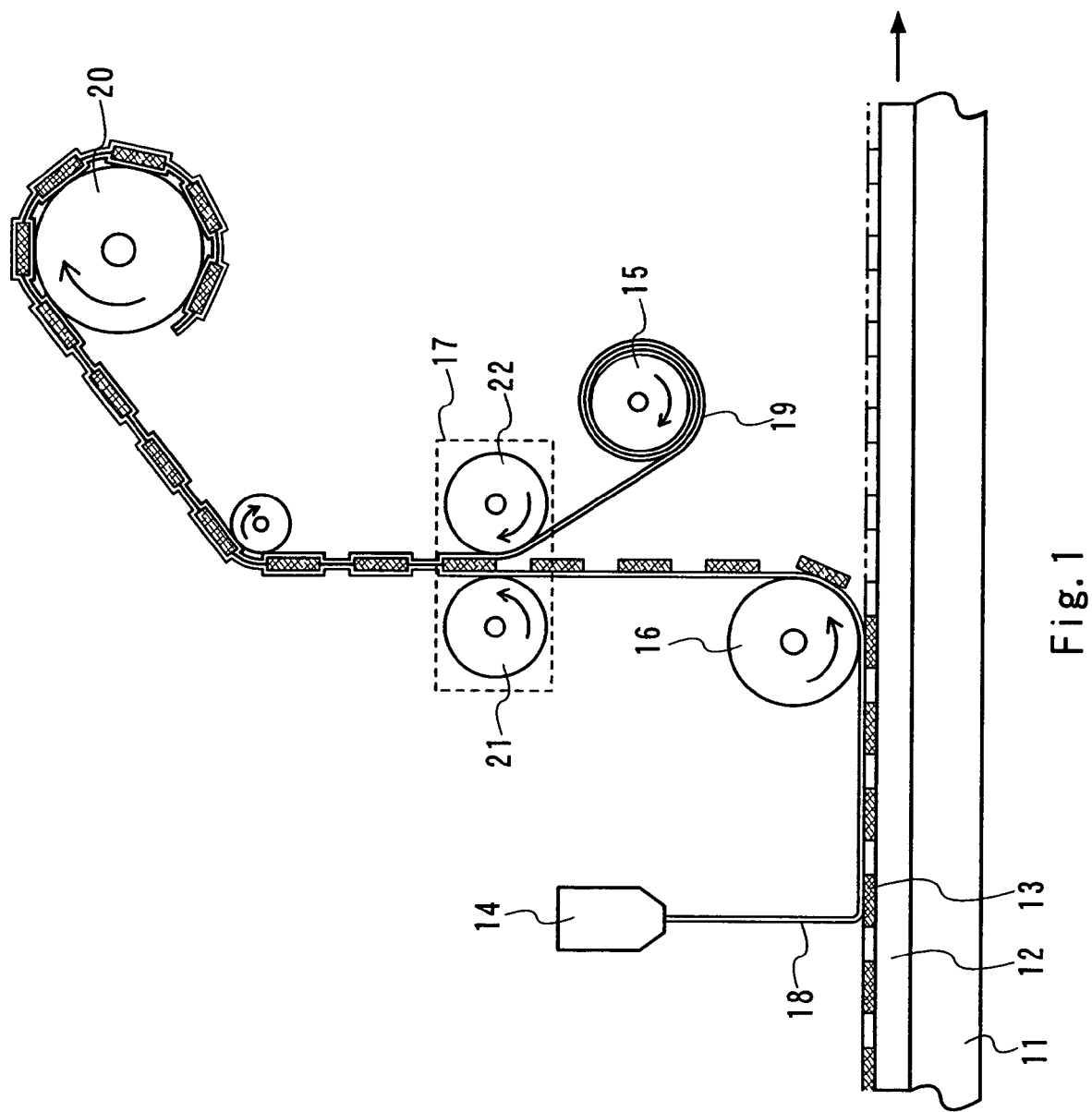
FIG. 1 is a figure showing a laminating system according to the invention.

Embodiment Modes and Embodiments of the invention will be described in detail with reference to the drawings. However, it is easily understood by those skilled in the art that the invention is not limited to the following descriptions and various changes may be made in forms and details without departing from the spirit and the scope of the invention. Therefore, the invention should not be limited by descriptions of Embodiment Modes and Embodiments below. The same reference numerals are commonly given to the same components in the structure of the invention to be described below.

Embodiment Mode 1

The invention provides a laminating system in which one of second and third substrates for sealing a thin film integrated circuit is supplied while being extruded in a heated and melted state and rollers are used for supplying the other substrate of the second and third substrates, receiving sealed IC chips, separating, and sealing. Major modes of the laminating system according to the invention will be described with reference to the drawings.

A first structure of the laminating system according to the invention is shown in FIG. 1. A laminating system according to the invention includes a transfer means 11 which transfers a first substrate 12 provided with a plurality of thin film integrated circuits 13, a die 14 which supplies a second substrate 18 while being extruded in a heated and melted state, a cooling roller 16, a supplying roller 15 wounded with a third substrate 19, a laminating means 17 which seals the thin film integrated circuits 13 between the second substrate 18 and the third substrate 19, and a receiving roller 20 to be wounded with the thin film integrated circuits 13 sealed between the second substrate 18 and the third substrate 19. The laminating means 17 includes rollers 21 and 22.

In the system shown in FIG. 1, the second substrate 18 is supplied over the first substrate 12 provided with the thin film integrated circuits while being extruded in a heated and melted state from the die 14. With the second substrate in a melted state supplied over the first substrate 12, the first substrate 12 is transferred to the cooling roller 16 by the transfer means 11. By cooling the second substrate 18 supplied over the first substrate 12 by the cooling roller 16, the second substrate in a melted state is cured, and the thin film integrated circuits 13 are attached to the second substrate. The second substrate to which the thin film integrated circuits 13 are attached is directed upward by the cooling roller 16; accordingly, the thin film integrated circuits 13 are separated from the first substrate 12. The second substrate 18 to which the thin film integrated circuits 13 are attached travels toward the laminating means 17. The third substrate 19 travels from the supplying roller 15 toward the laminating means 17. At the laminating means 17, when the thin film integrated circuits 13 of which one surface is attached to the second substrate 18 reaches the laminating means 17, the third substrate 19 is attached to the other surface of the thin film integrated circuits 13 by carrying out either or both of pressure treatment and heat treatment to seal the thin film integrated circuits 13 between the second substrate 18 and the third substrate 19. Finally, the sealed thin film integrated circuits 13 travel toward the receiving roller 20, and are wound around and received by the receiving roller 20.

In accordance with the above operations, the cooling roller 16, the roller 21 included in the laminating means 17, and the receiving roller 20 are provided in the laminating system according to the invention so that the second substrate 18 supplied from the die 14 passes them in order. The cooling roller 16 and the roller 21 rotate in the same direction. The roller 22 included in the laminating means 17 and the receiving roller 20 are provided so that the third substrate 19 supplied from the supplying roller 15 passes them in order. The supplying roller 15 and the roller 22 rotate in the same direction.

The transfer means 11 transfers the first substrate 12 provided with the plurality of thin film integrated circuits 13. For example, the transfer means corresponds to a conveyer belt, a plurality of rollers, or a robot arm. A robot arm transfers the first substrate 12 itself or transfers a stage provided with the first substrate 12. The transfer means 11 transfers the first substrate 12 at a predetermined speed in accordance with a speed at which the cooling roller 16 rotates. Note that the transfer means 11 may be provided with a heating means. The heating means corresponds to, for example, a heater with a heating wire or a heating medium such as oil. In this case, the thin film integrated circuits 13 can be separated from the first substrate 12 more easily by cooling the second substrate 18 by the cooling roller 16 with the first substrate 12 heated by the heating means included in the transfer means 11.

The supplying roller 15 is wound with the third substrate 19. The supplying roller 15 supplies the third substrate 19 to the laminating means 17 by rotating at a predetermined speed. The supplying roller 15 has a cylindrical shape and is formed from a resin material, a metal material, or the like.

A thermoplastic resin may be used for the second substrate 18. A thermoplastic resin used for the second substrate 18 preferably has a low softening point. For example, a polyolefin-based resin such as polyethylene, polypropylene, or polymethylpentene; a vinyl-based copolymer such as vinyl chloride, vinyl acetate, a vinyl chloride-vinyl acetate copolymer, an ethylene-vinyl acetate copolymer, vinylidene chloride, polyvinyl butyral, or polyvinyl alcohol; an acryl-based resin; a polyester-based resin; a urethane-based resin; a cellulose-based resin such as cellulose, cellulose acetate, cellulose acetate butyrate, cellulose acetate propionate, or ethyl cellulose; a styrene-based resin such as polystyrene or an acrylonitrile-styrene copolymer can be used. Note that the second substrate may be a single layer extruded from the die 14 or two or more layers co-extruded from the die 14.

A laminate film is used for the third substrate 19. A laminate film is formed from a resin material such as polypropylene, polyester, vinyl, polyvinyl fluoride, or vinyl chloride to have a plurality of layers. Processing such as embossing may be performed on a surface thereof. A laminate film includes a hot laminating type and a cold laminating type.

A hot laminating film includes an adhesive layer formed from a polyethylene resin or the like over a base film formed from polyester or the like. The adhesive layer is formed from a resin having a lower softening point than that of the base film. Thus, only the adhesive layer melts into a rubbery state by heating and cures by cooling. A material used for the base film may be PET (polyethyleneterephthalate), PEN (polyethylenenaphthalate), or the like as well as polyester. A material used for the adhesive layer may be polyethylene, polyester, EVA (ethylenevinylacetate), or the like as well as a polyethylene resin.

A cold laminating film includes an adhesive layer having adhesion properties at room temperature over a base film formed from, for example, polyester, vinyl chloride, or the like.

A surface on an adhesive layer side (a surface on a base film side) of the third substrate 19 may be coated with powders of silicon dioxide (silica). The coating can maintain water resistance even under an atmosphere of high temperature and high humidity.

Either or both of the second substrate 18 and the third substrate 19 may have light-transmitting properties. Further, either or both of the second substrate 18 and the third substrate 19 may be coated with a conductive material. The conductive material can be charged with static electricity, which protects the thin film integrated circuits 13 to be sealed. The third substrate 19 may be coated with a thin film containing carbon as a main component (a diamond-like carbon film) or a conductive material such as indium tin oxide (ITO) as a protective film.

The cooling roller 16 is a roller having a cooling means and is provided in order to separate the thin film integrated circuits 13 from the first substrate 12 by attaching one surface of the thin film integrated circuits 13 to one surface of the second substrate 18. The cooling means corresponds to a cooling medium such as cooling water. The thin film integrated circuits 13 are attached to the second substrate 18 and separated from the first substrate 12 by cooling the second substrate in a melted state to be cured by the cooling roller 16. Thus, the cooling roller 16 is provided opposite to the first substrate 12 on a side provided with the thin film integrated circuits 13. When the thin film integrated circuits 13 reaches below the cooling roller 16, the cooling roller 16 may be moved downward to press the second substrate 18 to the thin film integrated circuits 13 in order to more surely perform attachment between the second substrate 18 and the thin film integrated circuits 13. Note that, according to the above structure, the first substrate 12 is moved by the transfer means 11 and the cooling roller 16 is fixed; however, the invention is not limited thereto. The thin film integrated circuits 13 may be separated from the first substrate 12 by moving the cooling roller 16 while the first substrate 12 is fixed. The cooling roller 16 has a cylindrical shape and has, for example, a structure in which a cooling medium such as cooling water can flow inside and cooling is performed by supplying a cooling medium such as cooling water. The cooling roller 16 is formed from a resin material, a metal material, or the like, preferably, from a soft material.

When the thin film integrated circuits 13 of which one surface is attached to the second substrate 18 reach the laminating means 17, the laminating means 17 seals the thin film integrated circuits 13 between the second substrate 18 and the third substrate 19 while attaching the second substrate 19 to the other surface of the thin film integrated circuits 13. The laminating means 17 includes the roller 21 and the roller 22 opposed to each other. The other surface of the thin film integrated circuits 13 is attached to the third substrate 19 supplied from the supplying roller 15 toward the roller 22, and either or both of pressure treatment and heat treatment are performed using the roller 21 and the roller 22 when the third substrate 19 passes between the roller 21 and the roller 22. Through the above steps, the thin film integrated circuits 13 are sealed between the second substrate 18 and the third substrate 19.

In the case of using a hot laminating film as the second substrate 19, the roller 22 included in the laminating means 17 has a heating means. The heating means corresponds to, for example, a heater with a heating wire or a heating medium such as oil. By applying pressure while heating by the roller 22, the third substrate 19 is attached to the thin film integrated circuits 13 and the second substrate 18 to seal the thin film integrated circuits 13. When the roller 22 has a heating means and the roller 21 has a cooling means, the third substrate 19 of which adhesive layer is heated and melted by the roller 22 is cooled and cured quickly due to heat transfer from the roller 21. Thus, sealing can be performed more surely.

In the case of using a cold laminating film as the third substrate 19, the roller 22 need not have a heating means. The third substrate 19 is attached to the thin film integrated circuits 13 and the second substrate 18 by applying pressure by the roller 22 to seal the thin film integrated circuits 13.

The rollers 21 and 22 rotate at a predetermined speed in accordance with a speed at which the cooling roller 16 and the supplying roller 15 rotate. The rollers 21 and 22 have a cylindrical shape and are formed from a resin material, a metal material, or the like, preferably, from a soft material.

The receiving roller 20 is a roller which receives the thin film integrated circuits 13 sealed between the second substrate 18 and the third substrate 19 by winding them. The receiving roller 20 rotates at a predetermined speed in accordance with a speed at which the rollers 21 and 22 rotate. The receiving roller 20 has a cylindrical shape and is formed from a resin material, a metal material, or the like, preferably, from a soft material.

Thus, according to the system of the invention, processes of separating the plurality of thin film integrated circuits 13 over the first substrate 12, sealing the separated thin film integrated circuits, and receiving the sealed thin film integrated circuits can be continuously carried out by supplying the second substrate in a heated and melted state from the die 14 over the first substrate 12 provided with the plurality of thin film integrated circuits 13 and rotating the cooling roller 16, the supplying roller 15, the rollers 21 and 22, and the receiving roller 20. Therefore, the system according to the invention can provide high productivity and manufacturing efficiency.

Next, a laminating system having a structure different from the above laminating system will be described with reference to FIG. 2. A laminating system according to the invention includes a transfer means 11 which transfers a first substrate 12 provided with a plurality of thin film integrated circuits 13, a die 14 which supplies a second substrate 18 while being extruded in a heated and melted state, a supplying roller 15 wound with a third substrate 19, a laminating means 37 which attaches one surface of the thin film integrated circuits 13 provided over the first substrate 12 to the second substrate 18, separates the thin film integrated circuits 13 from the first substrate 12, and seals the thin film integrated circuits 13 between the second substrate 18 and the third substrate 19, and a receiving roller 20 to be wound with the sealed thin film integrated circuits 13. In this structure, a roller 32 opposed to a cooling roller 16 is provided and a laminating means 37 is constituted by the cooling roller 16 and the roller 32, and the structure is different in this point from the system shown in FIG. 1. In other words, the cooling roller 16 also serves as the roller 21 included in the laminating means 17 of the system shown in FIG. 1.

Figure 2:
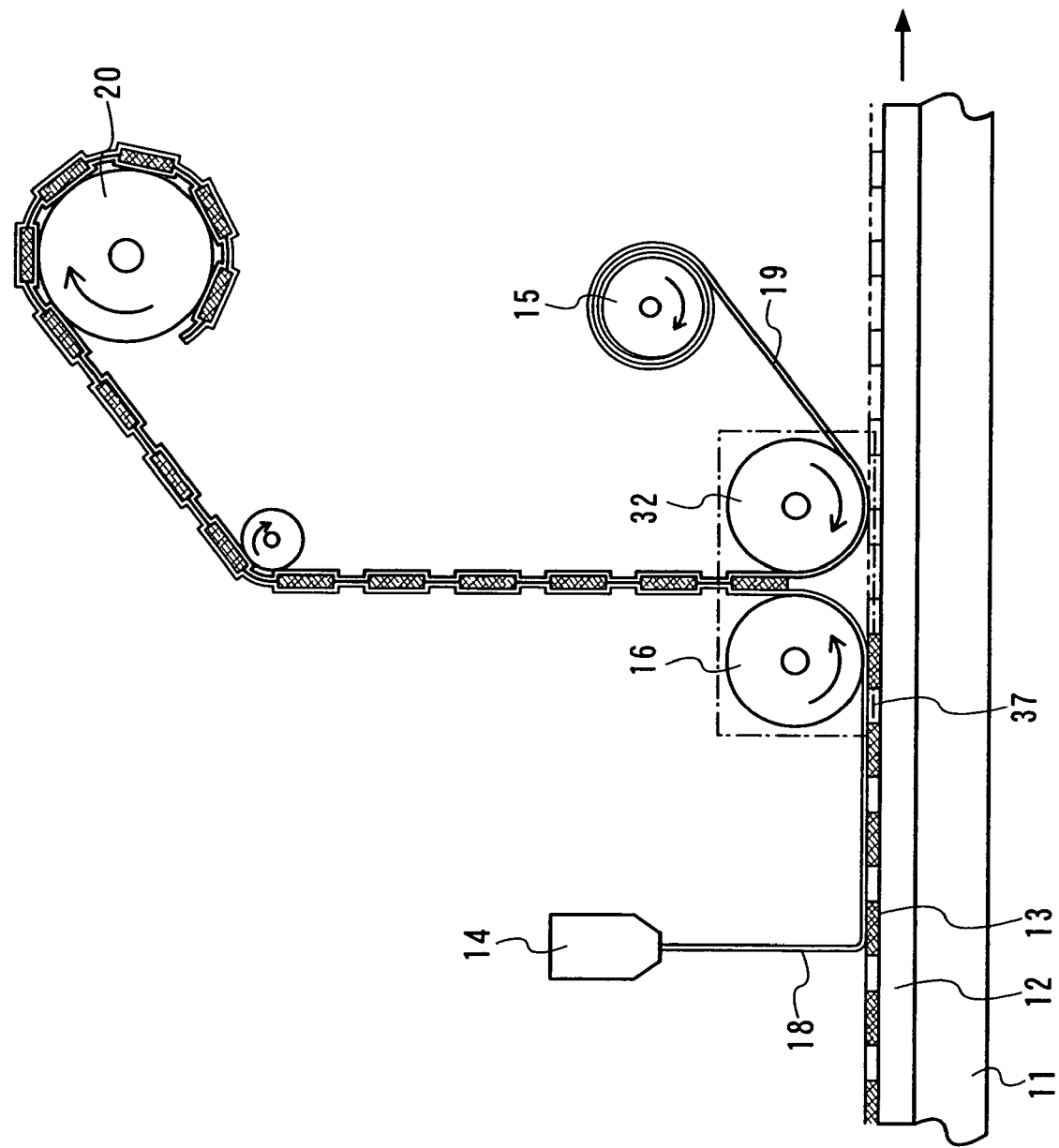
FIG. 2 is a figure showing a laminating system according to the invention.

Therefore, the system shown in FIG. 2 can save more space than the structure in which the cooling roller 16 is provided separately from the laminating means 17 as in the system shown in FIG. 1. The system shown in FIG. 2 can seal the thin film integrated circuits 13 immediately after the separation of the thin film integrated circuits 13 from the first substrate 12 by the cooling roller 16. Thus, the system can prevent damage and break of the thin film integrated circuits 13 which occur before sealing the thin film integrated circuits 13, and can increase yield.

In the system shown in FIG. 2, one surface of the thin film integrated circuits 13 is attached to the second substrate 18 by the cooling roller 16 and the thin film integrated circuits 13 are separated from the first substrate 12, while the other surface of the thin film integrated circuits 13 is attached to the third substrate 19 by the roller 32. Further, when the thin film integrated circuits 13 pass between the cooling roller 16 and the roller 32, the thin film integrated circuits 13 are sealed between the second substrate 18 and the third substrate 19 by performing either or both of pressure treatment and heat treatment.

In the case of using a hot laminating film as the third substrate 19, the roller 32 included in the laminating means 37 has a heating means. The heating means corresponds to, for example, a heater with a heating wire or a heating medium such as oil. By applying pressure while heating by the roller 32, the third substrate 19 is attached to the thin film integrated circuits 13 and the second substrate 18 to seal the thin film integrated circuits 13. When the roller 32 has a heating means and the cooling roller 16 is opposed to the roller 32, the third substrate 19 of which surface layer is heated and melted by the roller 32 is cooled and cured quickly due to heat transfer from the cooling roller 16 at the time of sealing using the cooling roller 16 and the roller 32. Thus, sealing can be performed more surely. When the thin film integrated circuits 13 reaches below the cooling roller 16, the cooling roller 16 and the roller 32 may be moved downward to press the second substrate 18 to the thin film integrated circuits 13 in order to more surely perform attachment between the second substrate 18 and the thin film integrated circuits 13.

In the case of using a cold laminating film as the third substrate 19, the roller 32 need not have a heating means. The third substrate 19 is attached to the thin film integrated circuits 13 and the second substrate 18 by applying pressure by the roller 32 to seal the thin film integrated circuits 13.

In accordance with the above operations, the cooling roller 16 and the receiving roller 20 are provided in the laminating system according to the invention so that the second substrate supplied from the die 14 passes them in order. The roller 32 and the receiving roller 20 are provided so that the third substrate supplied from the supplying roller 15 passes them in order. The supplying roller 15 and the roller 32 rotate in the same direction.

Thus, according to the system of the invention, processes of separating the plurality of thin film integrated circuits 13 over the first substrate 12, sealing the separated thin film integrated circuits, and receiving the sealed thin film integrated circuits can be continuously carried out by supplying the second substrate over the first substrate 12 provided with the plurality of thin film integrated circuits 13 while being extruded in a heated and melted state from the die 14 and rotating the cooling roller 16, the supplying roller 15, the roller 32, and the receiving roller 20. Therefore, the system according to the invention can provide high productivity and manufacturing efficiency.

Figure 3:
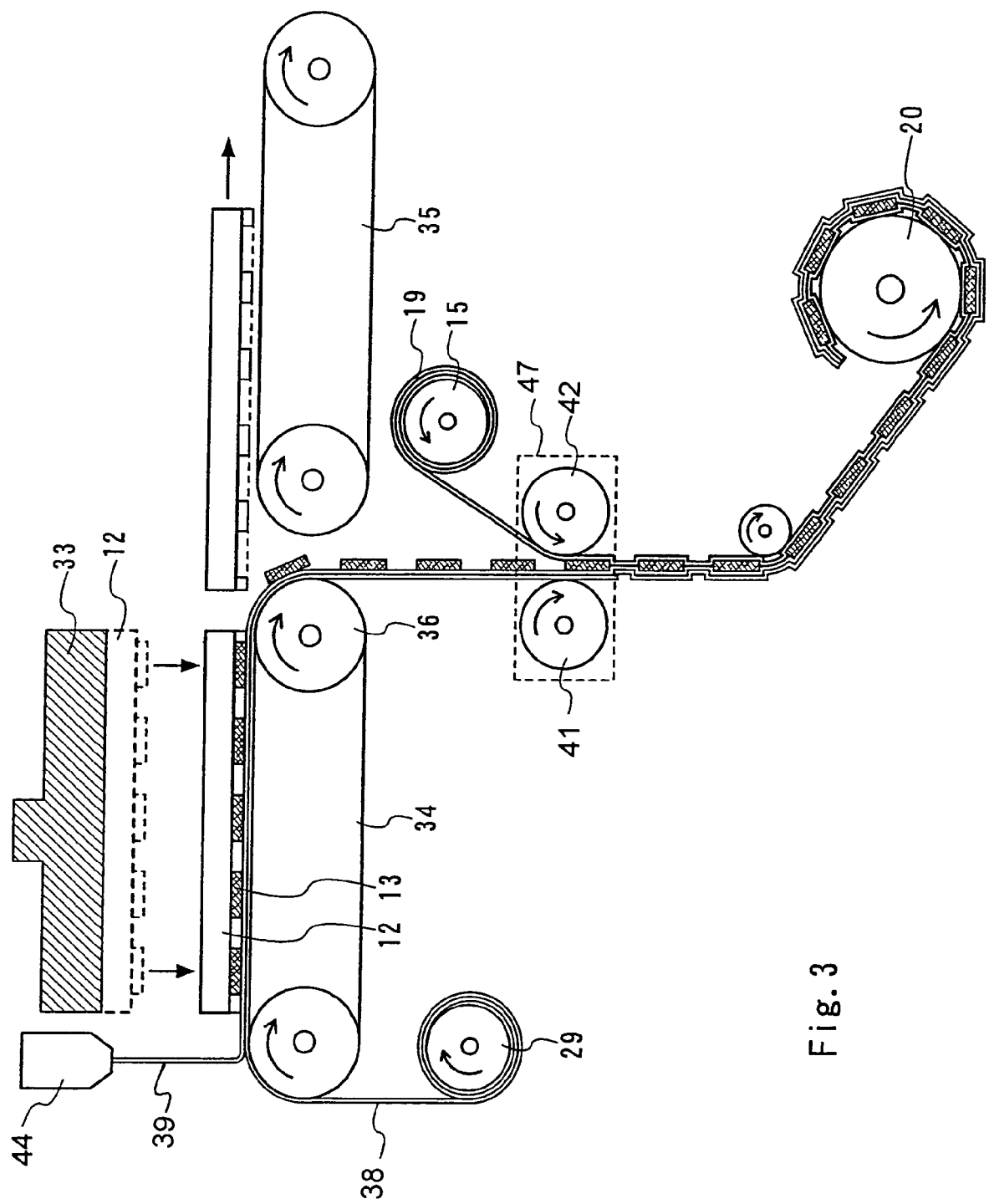
FIG. 3 is a figure showing a laminating system according to the invention.

According to the systems shown in FIGS. 1 and 2, the second substrate for separating the thin film integrated circuits is supplied while being extruded in a heated and melted state. However, the third substrate can be supplied while being extruded in a heated and melted state. A laminating system having a structure in which the third substrate is supplied while being extruded in a heated and melted state will be described with reference to FIG. 3.

A laminating system according to the invention includes a supplying roller 29 wound with a second substrate 38, a fixing and moving means 33 which fixes and moves a first substrate 12, a separating means 36 which attaches thin film integrated circuits 13 to the second substrate 38 and separates the thin film integrated circuits 13 from one surface of the first substrate 12, a die 44 which supplies a third substrate 39 while being extruded in a heated and melted state, a laminating means 47 which seals the thin film integrated circuits 13 between the second substrate 38 and the third substrate 39, and a receiving roller 20 to be wound with the sealed thin film integrated circuits 13. Further, a first transfer means 34 and a second transfer means 35 are also included in addition to the above components. The structure shown in FIG. 3 has an upside-down structure of that shown in FIG. 1 and is newly provided with the fixing and moving means 33, the first transfer means 34, and the second transfer means 35.

According to this system, the second substrate 38 supplied from the supplying roller 29 is transferred by the first transfer means 34. The first substrate 12 is placed above the second substrate 38 by the fixing and moving means 33 and pressed to the second substrate 38 so that one surface of the thin film integrated circuits 13 formed over the first substrate 12 is attached to the second substrate 38. Subsequently, the thin film integrated circuits 13 are separated from the first substrate 12 by the separating means 36 included in the first transfer means 34, and the substrate 12 after the separation of the thin film integrated circuits 13 is transferred by the second transfer means 35. The second substrate 38 to which the thin film integrated circuits 13 are attached is supplied between a crimping roller 41 and a cooling roller 42 included in the laminating means 47. The third substrate 39 is supplied between the crimping roller 41 and the cooling roller 42 included in the laminating means 47 while being extruded in a heated and melted state from the die 44. The third substrate 39 is attached to the other surface of the thin film integrated circuits 13 (surface of the thin film integrated circuits 13 which is not attached to the second substrate) by cooling the second substrate 38 and the third substrate 39 introduced between the crimping roller 41 and the cooling roller 42 while applying pressure by the crimping roller 41 and the cooling roller 42, and the thin film integrated circuits 13 are sealed between the second substrate 38 and the third substrate 39. Finally, the sealed thin film integrated circuits 13 travel toward the receiving roller 20, and are wound around and received by the receiving roller 20.

In accordance with the above operations, the separating means 36 included in the first transfer means 34, the crimping roller 41 included in the laminating means 47, and the receiving roller 20 are provided in the laminating system according to the invention so that the second substrate 38 supplied from the supplying roller 29 passes them in order. The separating means 36 and the crimping roller 41 rotate in the same direction. The first transfer means 34 and the second transfer means 35 are provided so that the first substrate 12 passes them in order. The cooling roller 42 included in the laminating means 47 and the receiving roller 20 are provided so that the third substrate 39 supplied from the die 44 passes them in order.

The fixing and moving means 33 has a function of fixing the first substrate 12 so that a surface of the first substrate 12 provided with the thin film integrated circuits 13 (hereinafter referred to as one surface of the first substrate) is opposed to the second substrate 38 and a function of moving the first substrate 12 in order to attach the thin film integrated circuits 13 formed over the first substrate 12 to the second substrate 38. The first substrate 12 is fixed by a vacuum adsorption method or the like. The first substrate 12 is moved by moving the fixing and moving means 33. Note that the fixing and moving means 33 may process the first substrate 12 one by one as shown in the figure, or may have a shape of a cylinder or a polyhedron such as a prism. In the case of using one with the shape of a cylinder or a prism, the first substrate 12 is fixed to a side surface thereof, and the first substrate 12 is moved by rotating the cylinder or the prism.

The first transfer means 34 transfers the second substrate 38 and the first substrate 12 provided with the plurality of thin film integrated circuits 13 over the second substrate 38. The separating means 36 disposed on an end of the first transfer means 34 attaches one surface of the thin film integrated circuits 13 to the second substrate 38 and separates the thin film integrated circuits 13 from one surface of the first substrate 12. In the structure shown in the figure, the separating means 36 corresponds to a roller. The second transfer means 35 transfers the first substrate 12 from which the thin film integrated circuits 13 are separated.

A laminate film is used as the second substrate 38. A laminate film is formed from a resin material such as polypropylene, polyester, vinyl, polyvinyl fluoride, or vinyl chloride to have a plurality of layers. Processing such as embossing may be performed on a surface thereof. A laminate film includes a hot laminating type and a cold laminating type.

A hot laminating film includes an adhesive layer formed from a polyethylene resin or the like over a base film formed from polyester or the like. The adhesive layer is formed from a resin having a lower softening point than that of the base film. Thus, only the adhesive layer melts into a rubbery state by heating and cures by cooling. A material used for the base film may be PET (polyethyleneterephthalate), PEN (polyethylenenaphthalate), or the like as well as polyester. A material used for the adhesive layer may be polyethylene, polyester, EVA (ethylenevinylacetate), or the like as well as a polyethylene resin.

A cold laminating film includes an adhesive layer having adhesion properties at room temperature over a base film formed from, for example, polyester, vinyl chloride, or the like.

A surface opposite to the adhesive layer (surface on a base film side) of the second substrate 38 may be coated with powders of silicon dioxide (silica). The coating can maintain water resistance even under an atmosphere of high temperature and high humidity.

In the case of using a hot laminating film as the second substrate, the first transfer means has a heating means. In that case, when the separating means 36 included in the first transfer means 34 has a cooling means, the second substrate 38 of which surface layer is heated and melted by the heating means included in the first transfer means 34 is cooled and cured quickly by the separating means 36. Then, the thin film integrated circuits 13 can be attached to the second substrate and can be separated from the first substrate 12. Note that the cooling means may be provided before the separating means 36 of the first transfer means 34.

A thermoplastic resin may be used for the third substrate 39. A thermoplastic resin used for the third substrate 39 preferably has a low softening point. For example, a polyolefin-based resin such as polyethylene, polypropylene, or polymethylpentene; a vinyl-based copolymer such as vinyl chloride, vinyl acetate, a vinyl chloride-vinyl acetate copolymer, an ethylene-vinyl acetate copolymer, vinylidene chloride, polyvinyl butyral, or polyvinyl alcohol; an acrylic resin; a polyester-based resin; a urethane-based resin; a cellulose-based resin such as cellulose, cellulose acetate, cellulose acetate butyrate, cellulose acetate propionate, or ethyl cellulose; a styrene-based resin such as polystyrene or an acrylonitrile-styrene copolymer can be used. Note that the third substrate may be a single layer extruded from the die 44 or two or more layers co-extruded from the die 44.

Either or both of the second substrate 38 and the third substrate 39 may have light-transmitting properties. Further, either or both of the second substrate 18 and the third substrate 19 may be coated with a conductive material. The conductive material can be charged with static electricity, which protects the thin film integrated circuits 13 to be sealed. The second substrate 38 may be coated with a thin film containing carbon as a main component (a diamond-like carbon film) or a conductive material such as indium tin oxide (ITO) as a protective film.

After the thin film integrated circuits 13 are separated from the first substrate 12, the third substrate is supplied while being extruded in a heated and melted state from the die 44, the third substrate 39 is attached to the other surface of the thin film integrated circuits 13 (surface not attached to the second substrate 38) by the laminating means 47, and the thin film integrated circuits 13 are sealed between the second substrate 38 and the third substrate 39. Subsequently, the sealed thin film integrated circuits 13 are received by the receiving roller 20.

According to the system of the invention, processes of separating the plurality of thin film integrated circuits 13 over the first substrate 12, sealing the separated thin film integrated circuits, and receiving the sealed thin film integrated circuits can be carried out continuously by rotating the first transfer means 34, the second transfer means 35, the supplying roller 29, the crimping roller 41, the cooling roller 42, and the receiving roller 20. Therefore, the system according to the invention can provide high productivity and manufacturing efficiency.

Figure 4:
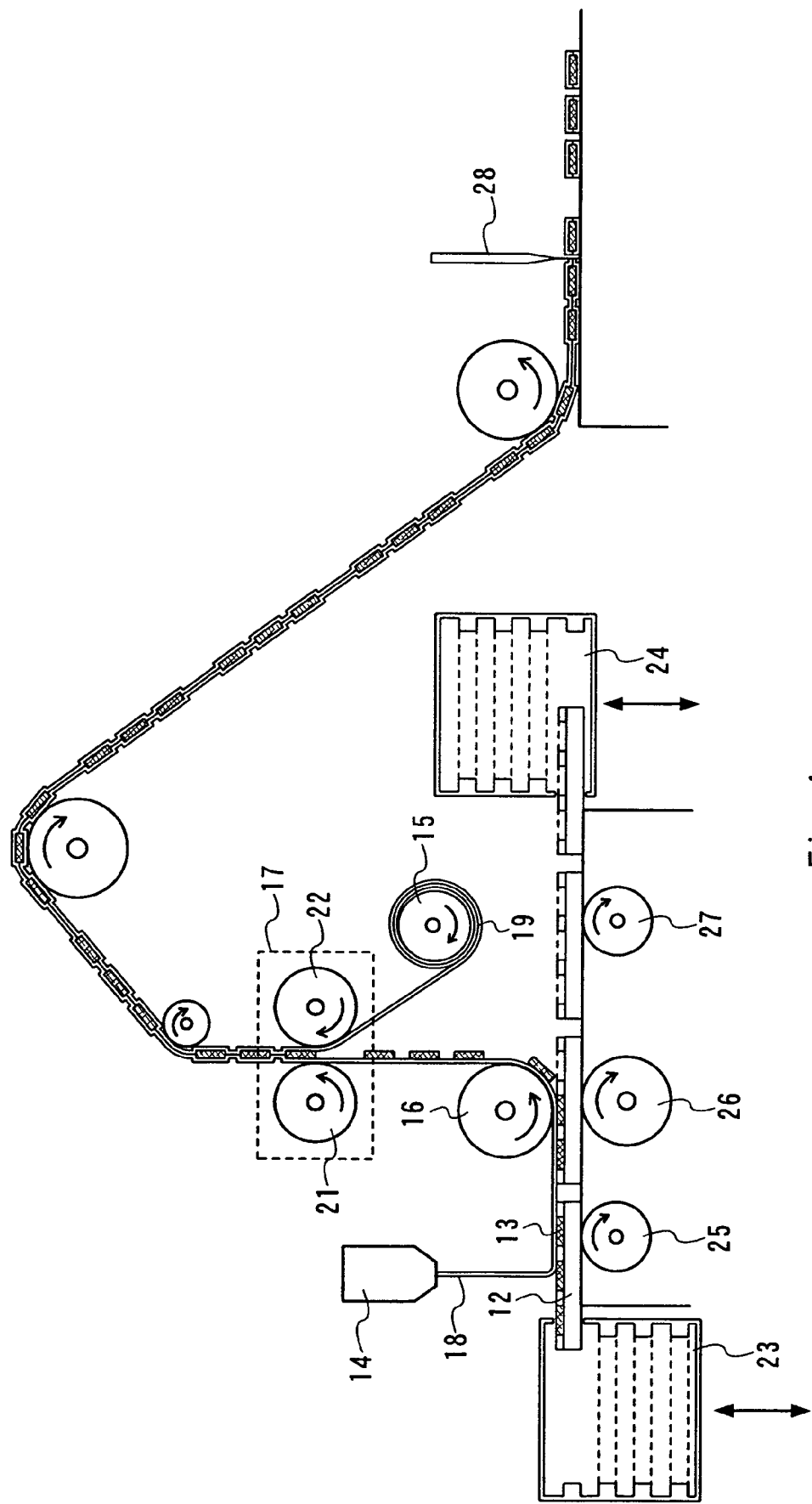
FIG. 4 is a figure showing a laminating system according to the invention.

Next, an overall structure of a laminating system will be described with reference to FIG. 4. Here, a structure of a laminating system having the structure shown in FIG. 1 will be described. Note that the same reference numeral is given to the same component in FIG. 4 as that in FIG. 1.

A first cassette 23 is a cassette for supplying a substrate, and a first substrate 12 provided with a plurality of thin film integrated circuits 13 is set therein. A second cassette 24 is a cassette for receiving a substrate, and the first substrate 12 after separating the thin film integrated circuits 13 is to be set therein. A plurality of rollers 25 to 27 is provided as a transfer means between the first cassette 23 and the second cassette 24. The first substrate 12 is transferred by rotating the rollers 25 to 27. Although the case of using three rollers is shown in FIG. 4, it goes without saying that the number of rollers is not limited thereto. Thereafter, as previously described in describing the laminating system of FIG. 1, the thin film integrated circuits 13 are separated from the first substrate 12 and sealed, and the sealed thin film integrated circuits 13 are cut by a cutting means 28. The cutting means 28 may use a dicing system, a scribing system, a laser irradiation apparatus (particularly, a $CO_2$ laser irradiation apparatus), or the like. The sealed thin film integrated circuits 13 are completed through the above steps.

In the structures shown in FIGS. 1 to 4, the thin film integrated circuits 13 provided over the first substrate 12 each include an element group of a plurality of elements and a conductive layer serving as an antenna. However, the invention is not limited thereto. The thin film integrated circuits 13 provided over the first substrate 12 may only include an element group. The conductive layer serving as an antenna may be attached to the third substrate 19, and the plurality of elements included in the thin film integrated circuits 13 may be connected to the conductive layer in attaching the thin film integrated circuits 13 to the third substrate 19.

Embodiment Mode 2

Figure 13:
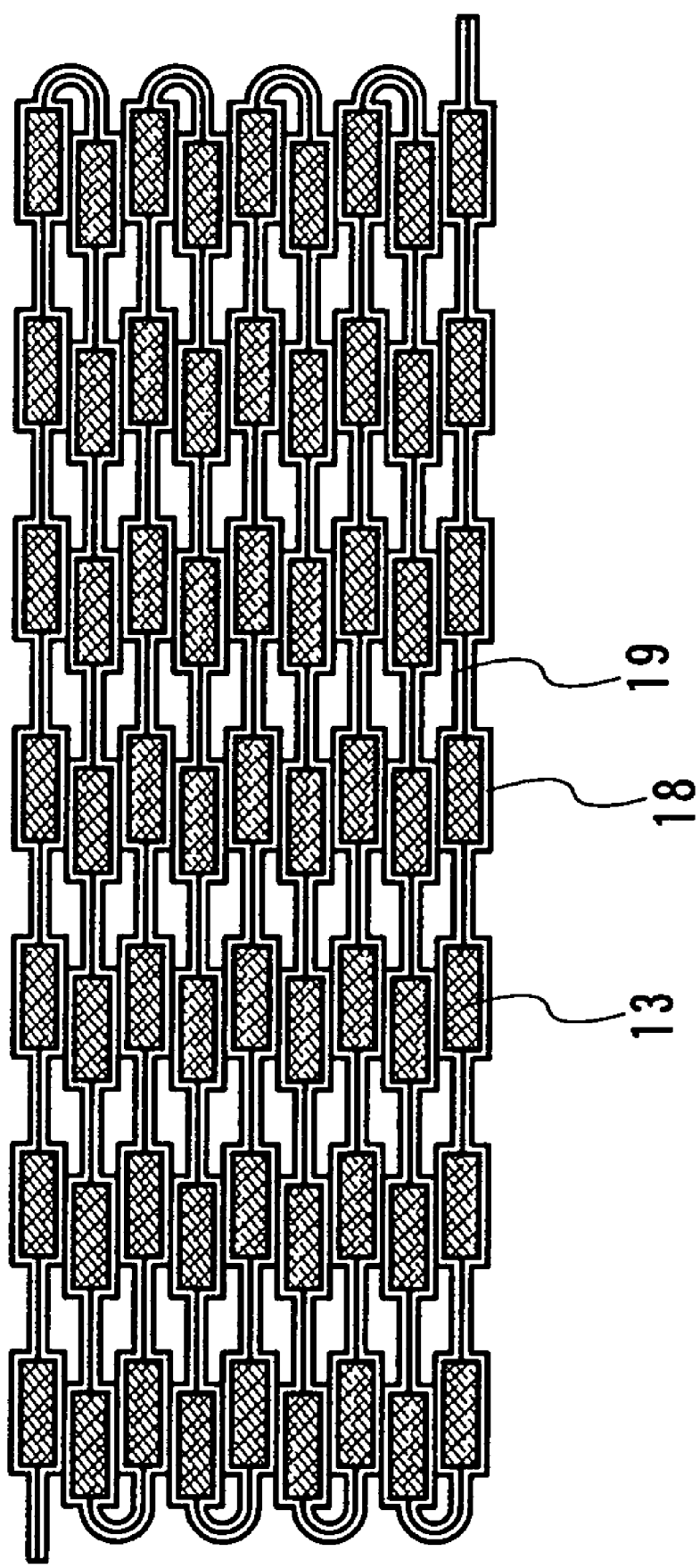
FIG. 13 is a figure showing an IC sheet according to the invention.

A structure of an IC sheet (also referred to as an IC film, a sheet body, or a film body) according to the invention will be described. An IC sheet according to the invention is a second substrate 18 and a third substrate 19 sealing each of a plurality of thin film integrated circuits 13 on both surfaces, which are wound in a roll shape (see a cross-sectional view of an IC sheet in FIG. 13). Each of the plurality of thin film integrated circuits 13 has a plurality of elements and a conductive layer serving as an antenna. Each of the plurality of thin film integrated circuits 13 is arranged regularly.

As described above, a sheet-like IC sheet including the plurality of thin film integrated circuits 13 sealed between a pair of substrates is easy to be shipped. In particular, it is advantageous in the shipment of a large amount of the thin film integrated circuits 13. Further, the plurality of thin film integrated circuits 13 is difficult to be handled when divided; however, an IC sheet provided by the invention has a sheet shape, so that it is easy to handle, and the break and damage of the thin film integrated circuits 13 can be prevented.

Embodiment Mode 3

A structure of a roll (also referred to as a wound body, a roll body, a wound object, or the like) of an IC sheet according to the invention will be described. A roll of an IC sheet according to the invention is a wound substrate, more specifically, a second substrate 18 and a third substrate 19 sealing each of a plurality of thin film integrated circuits 13, which are wound in a roll shape (see a cross-sectional view of a roll of an IC sheet in FIG. 12A and a perspective view of a roll of an IC sheet in FIG. 12B). Each of the plurality of thin film integrated circuits 13 has a plurality of elements and a conductive layer serving as an antenna. The plurality of thin film integrated circuits 13 is arranged regularly.

As described above, a roll of an IC sheet including the plurality of thin film integrated circuits 13 sealed between a pair of substrates can be easily shipped. In particular, it is advantageous in the shipment of a large amount of the thin film integrated circuits 13. Further, the plurality of thin film integrated circuits 13 is difficult to be handled when divided; however, a roll of an IC sheet provided by the invention is in a wound state. Therefore, it is easy to handle, and the break and damage of the thin film integrated circuits 13 can be prevented.

Embodiment Mode 4

A method for manufacturing an IC chip according to the invention will be described with reference to the drawings. First, separation layers 101 to 103 are formed over a first substrate 100 (FIG. 5A). The first substrate 100 corresponds to a glass substrate, a quartz substrate, a plastic substrate, a resin substrate formed of a flexible synthetic resin such as acrylic, a metal substrate, a silicon substrate, or the like. Note that, in the case where a silicon substrate is used, a separation layer is not required to be provided. The separation layers 101 to 103 are layers containing silicon which are formed by sputtering, plasma CVD, or the like. The layer containing silicon corresponds to an amorphous semiconductor layer, a semi-amorphous semiconductor layer in which an amorphous state and a crystalline state are mixed, a crystalline semiconductor layer, or the like which contains silicon.

The separation layers 101 to 103 are each formed of a layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si) or an alloy material or a compound material containing the element as a main component, which is formed by a known method (such as sputtering or plasma CVD). The separation layers each may have a single layer structure or a layered structure.

Figure 8:
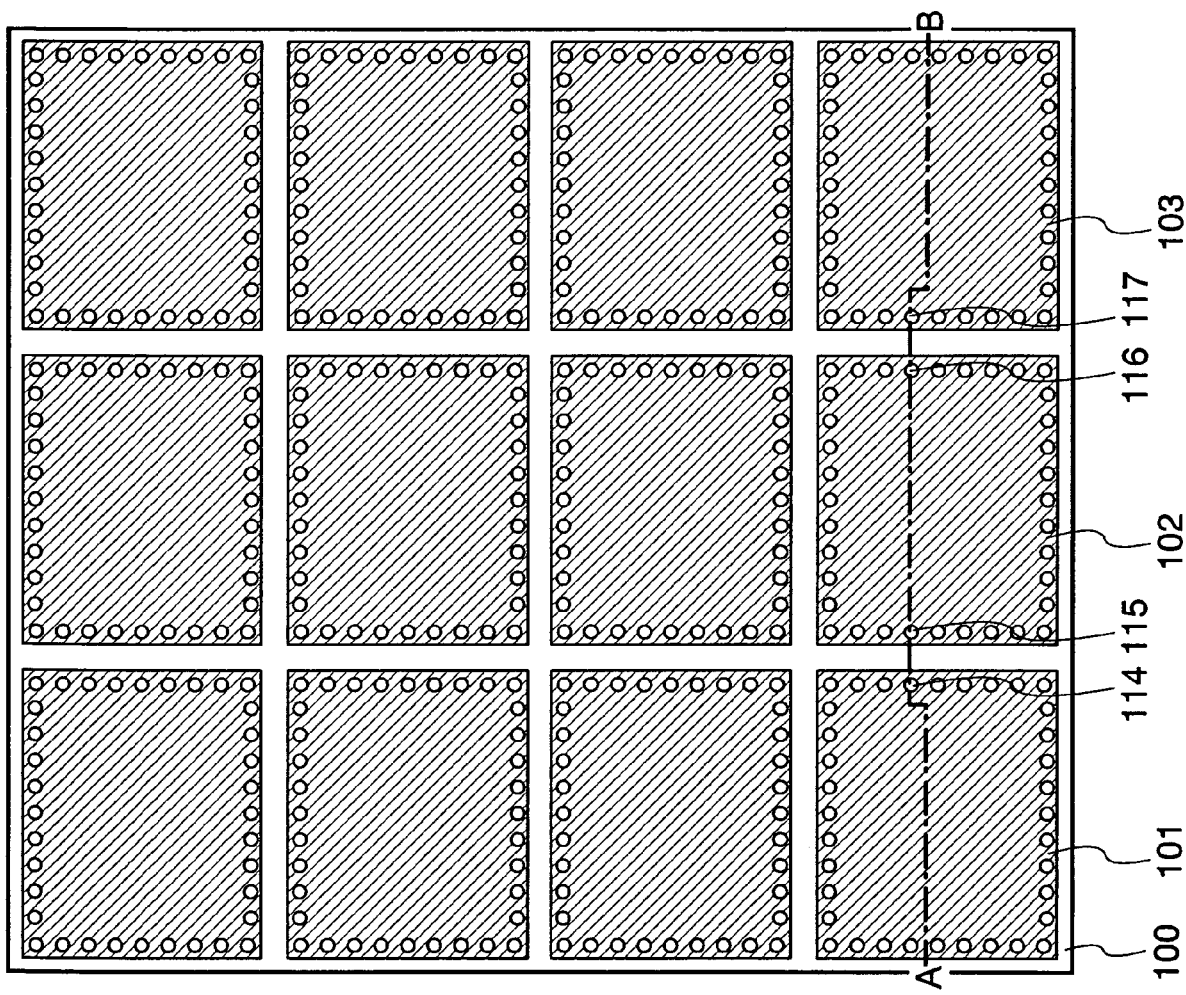
FIG. 8 is a figure showing a method for manufacturing an IC chip.

The separation layers 101 to 103 are selectively formed over the first substrate 100. A top view thereof is shown in FIG. 8. FIGS. 5A and 5B each show a cross-sectional view taken along line A-B in FIG. 8. Such selective formation is carried out in order to prevent scatter of a plurality of thin film integrated circuits 112 provided over the separation layers 101 to 103 after removing the separation layers 101 to 103.

Next, a base insulating film 104 is formed over the separation layers 101 to 103. Subsequently, an element group 105 is formed over the insulating film 104. The element group 105 includes one or more of the following: a thin film transistor, a capacitor, a resistor, a diode, and the like. FIGS. 5A and 5B show an example in which a thin film transistor having a GOLD structure is formed as the element group 105; however, a thin film transistor having an LDD structure may be formed by providing a side face of a gate electrode with a side wall. Next, an insulating film 108 is formed to cover the element group 105, and an insulating film 109 is formed over the insulating film 108. A conductive layer 110 serving as an antenna is formed over the insulating film 109. Further, an insulating film 111 serving as a protective film is formed over the conductive layer 110. Through the above steps, the thin film integrated circuit 112 including the element group 105 and the conductive layer 110 is completed.

The insulating films 108, 109, and 111 are formed from an organic material or an inorganic material. Polyimide, acrylic, polyamide, siloxane, epoxy, or the like is used as an organic material. Siloxane includes a skeleton formed from a bond of silicon (Si) and oxygen (O), and an organic group containing at least hydrogen (for example, an alkyl group or an aromatic hydrocarbon) or a fluoro group is used for a substituent, or an organic group containing at least hydrogen and a fluoro group are used for substituents. Silicon oxide, silicon nitride, silicon oxynitride, silicon nitride oxide, or the like is used for an inorganic material.

Instead of selectively forming the separation layers 101 to 103, the insulating film 111 may have thick thickness for preventing the thin film integrated circuit 112 from scattering. When the thickness of the insulating film 111 is thicker than normal, the thin film integrated circuit 112 can be prevented from scattering, owing to the weight of the insulating film 111.

Next, openings 114 to 117 are respectively formed between the adjacent thin film integrated circuits 112 so as to expose the separation layers 101 to 103 (FIG. 5B). The openings 114 to 117 are formed by etching using a mask, dicing, laser light irradiation, or the like.

Figure 6A:
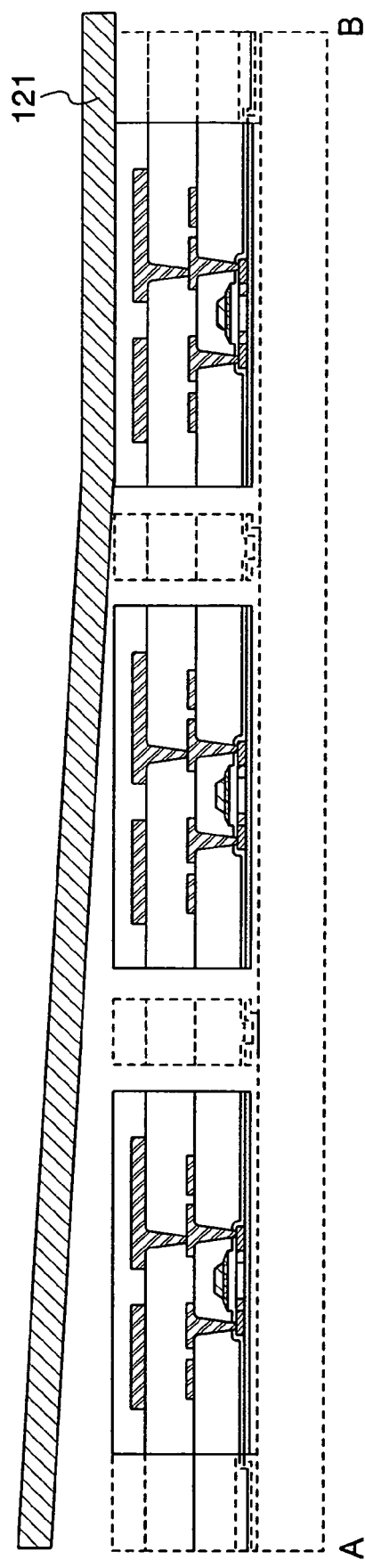
FIGS. 6A and 6B are figures showing a method for manufacturing an IC chip.

Subsequently, an etchant for removing the separation layers 101 to 103 is introduced into the openings 114 to 117 to make the separation layers 101 to 103 gradually recede, thereby removing them (FIG. 6A). A gas or a liquid containing halogen fluoride is used as the etchant. For example, chlorine trifluoride (ClF$_3$) is used as halogen fluoride.

Alternatively, nitrogen trifluoride (NF$_3$), bromine trifluoride (BrF$_3$), or hydrogen fluoride (HF) may be used as halogen fluoride. Note that hydrogen fluoride is used in the case of forming a layer containing silicon as a separation layer.

As described above, the separation layers 101 to 103 are selectively formed here; thus, a part of the insulating film 104 is in contact with the first substrate 100 after removing the separation layers 101 to 103. Therefore, the thin film integrated circuit 112 can be prevented from scattering. Next, one surface of the thin film integrated circuits 112 is attached to a second substrate 121. Correspondingly, the thin film integrated circuit 112 is separated from the first substrate 100.

In the above steps, a part of the insulating film 104 remains over the first substrate 100; however, the invention is not limited thereto. In the case where the adhesion between the first substrate 100 and the insulating film 104 is poor, the insulating film 104 is completely separated from the first substrate 100 in some cases by carrying out the above steps.

Figure 6B:
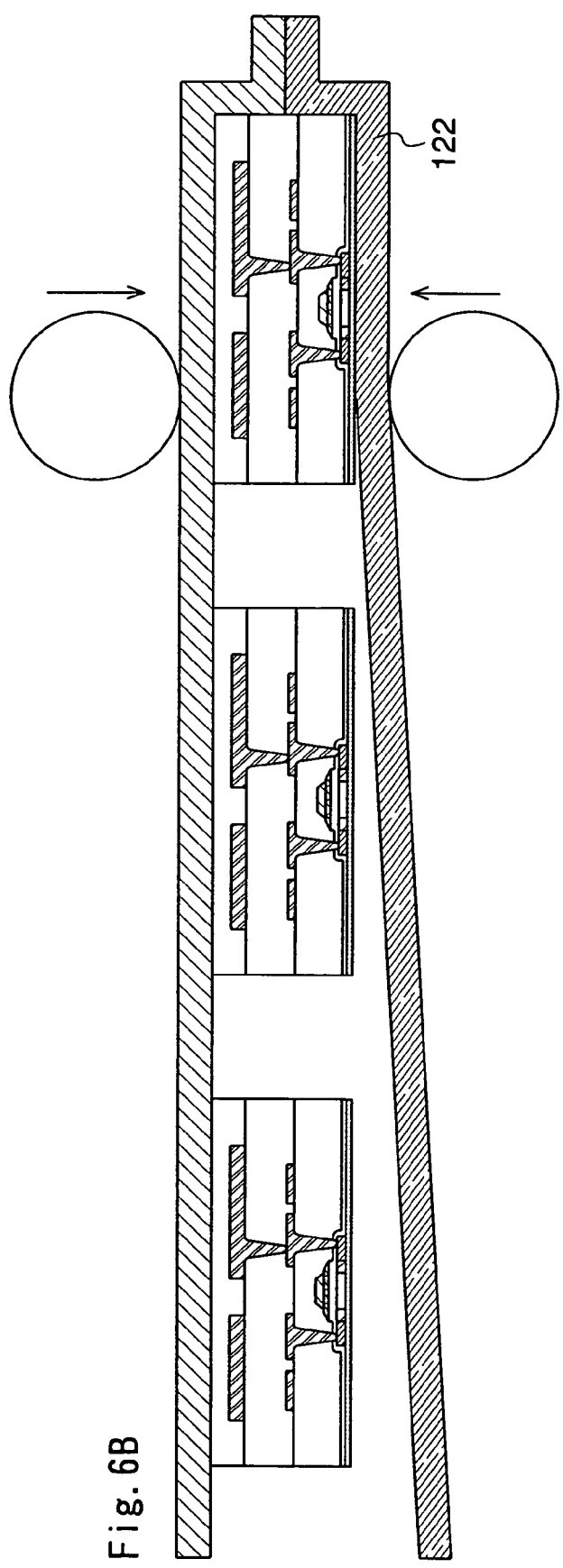

Next, the other surface of the thin film integrated circuits 112 is attached to a third substrate 122, and the thin film integrated circuits 112 are sealed between the second substrate 121 and the third substrate 122 (FIG. 6B). Thus, the thin film integrated circuits 112 are sealed between the second substrate 121 and the third substrate 122.

Figure 7A:
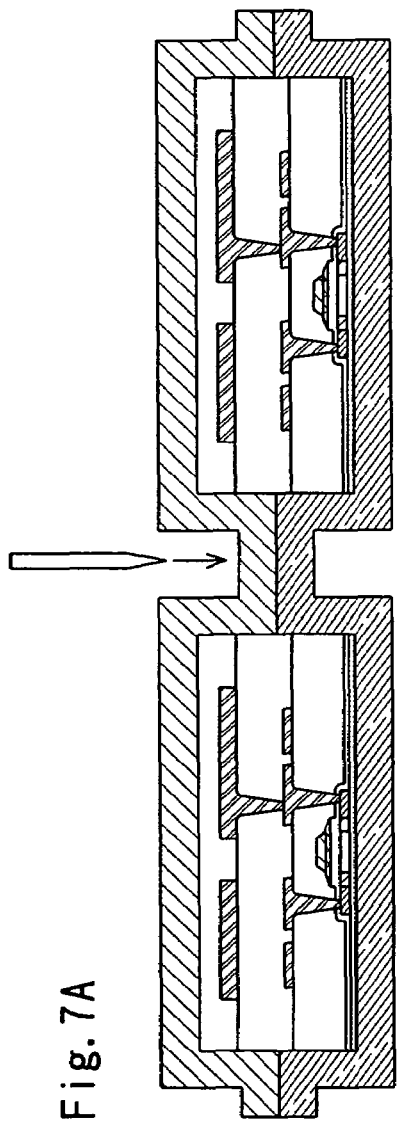
FIGS. 7A and 7B are figures showing a method for manufacturing an IC chip.
Figure 7B:
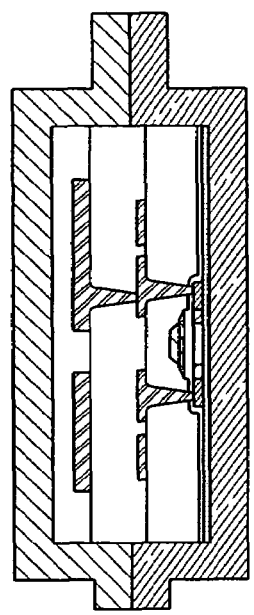

A part of the second substrate 121 and the third substrate 122 between the thin film integrated circuits 112 is cut by dicing, scribing, or laser cutting. Thus, a sealed IC chip is completed (FIGS. 7A and 7B).

A sealed IC chip completed through the above steps has the size of 5 mm square (25 mm$^2$) or less, preferably, 0.3 mm square (0.09 mm$^2$) to 4 mm square (16 mm$^2$).

Since a thin film integrated circuit formed over an insulating substrate is used for an IC chip according to the invention in the case of not using a silicon substrate, there is less limitations on the shape of a mother substrate compared with the case of a chip formed from a circular silicon wafer. That increases the productivity of the IC chip and makes it possible to mass-produce the IC ship. Consequently, the cost of the IC chip can be reduced. Further, a semiconductor film with a thickness of 0.2 µm or less, typically, 40 nm to 170 nm, preferably, 50 nm to 150 nm is used for an IC chip according to the invention; thus, the IC chip is very thin compared with a chip formed from a silicon substrate. As a result, the presence of the thin film integrated circuit is hardly noticed even when it is mounted on an article, which leads to protection against falsification. Further, an IC chip according to the invention can receive signals with high sensitivity without electromagnetic wave absorption compared with an IC chip formed from a silicon substrate. In the case where a silicon substrate is not used, the thin film integrated circuit can have light-transmitting properties. Therefore, the IC chip according to the invention can be applied to various articles; for example, it can be mounted on a printed surface without spoiling the design. This embodiment mode can be freely combined with any one of the above embodiment modes.

Embodiment 1

An IC chip formed with the use of a laminating system according to the invention includes a plurality of elements and a conductive layer serving as an antenna. The plurality of elements corresponds to a thin film transistor, a capacitor, a resistor, a diode, or the like, for example.

Figure 9:
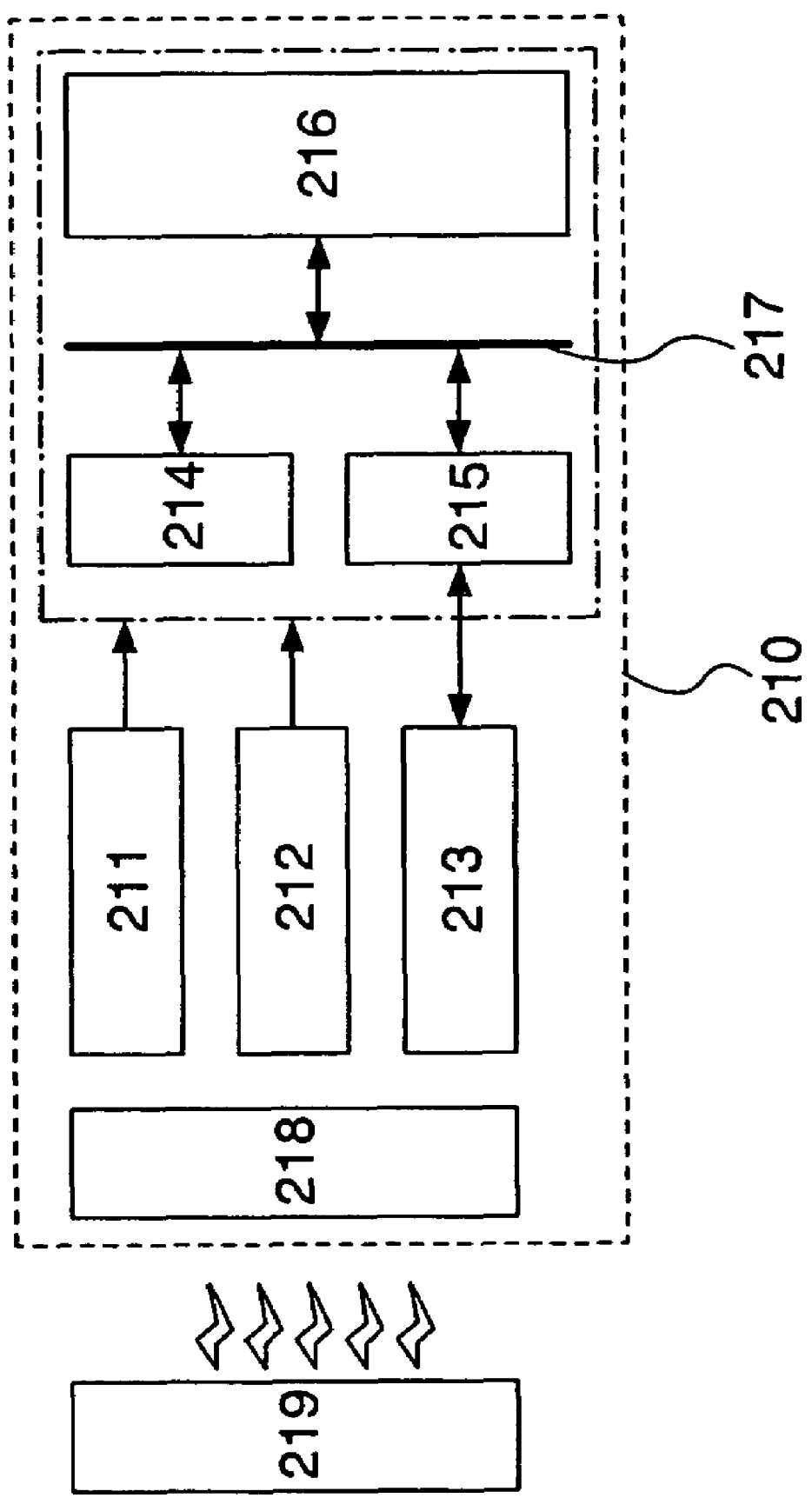
FIG. 9 is a figure showing an IC chip.

An IC chip 210 has a function of communicating data without contact and is constituted by a variety of circuits. The IC chip 210 is provided with, for example, a power circuit 211, a clock generator circuit 212, a data demodulation/modulation circuit 213, a control circuit 214 (corresponding to a CPU or an MPU, for example), an interface circuit 215, a memory 216, a data bus 217, an antenna (also referred to as an antenna coil) 218, and the like (FIG. 9)

The power circuit 211 is a circuit which generates a variety of power sources which are to be supplied to the above respective circuits based on an AC signal inputted from the antenna 218. The clock generator circuit 212 is a circuit for generating various clocks to be supplied to the above respective circuits based on an AC signal inputted from the antenna 218. The data demodulation/modulation circuit 213 has a function of demodulating/modulating data in communication with a reader/writer 219. The control circuit 214 corresponds to, for example, a central processing unit (CPU), a micro processor unit (MPU), or the like and has a function of controlling other circuits. The antenna 218 has a function of transmitting and receiving an electromagnetic field or electric wave. The reader/writer 219 controls processes regarding communication with a thin film integrated circuit control of the thin film integrated circuit, and data of the thin film integrated circuit.

Note that the structure of circuits constituting a thin film integrated circuit is not limited to the above structure. For example, a structure with another component such as a limiter circuit for source voltage or hardware dedicated to cryptographic processing may be used.

Embodiment 2

Figure 10E:
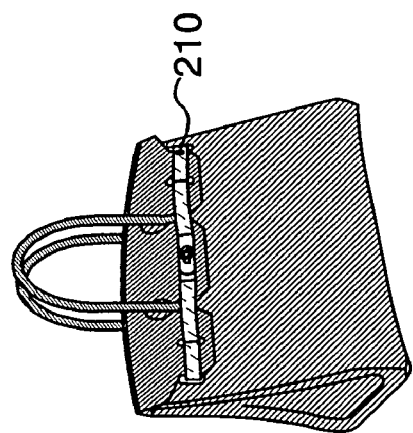
FIGS. 10A to 10E are figures showing usage patterns of IC chips.
Figure 10B:
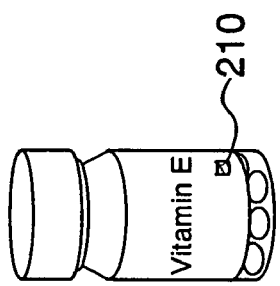
Figure 10D:
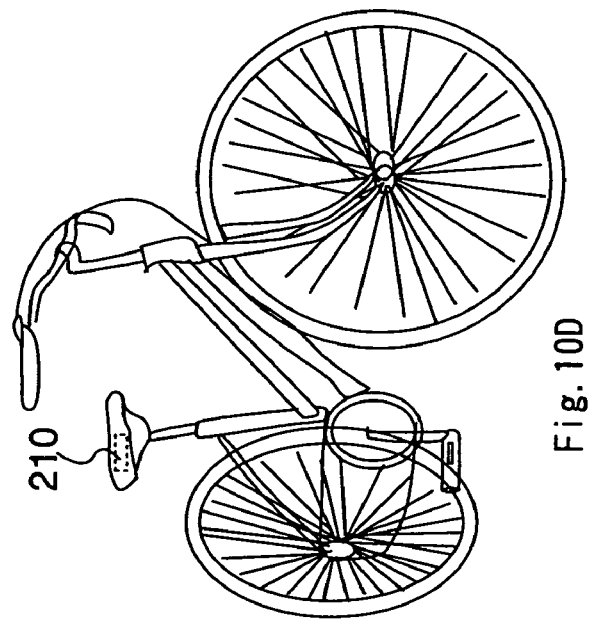
Figure 10A:
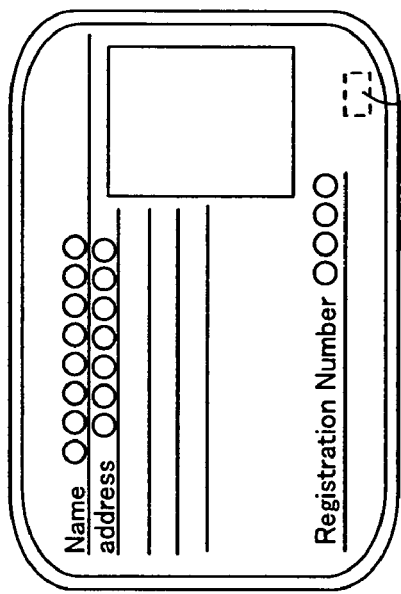
Figure 10C:
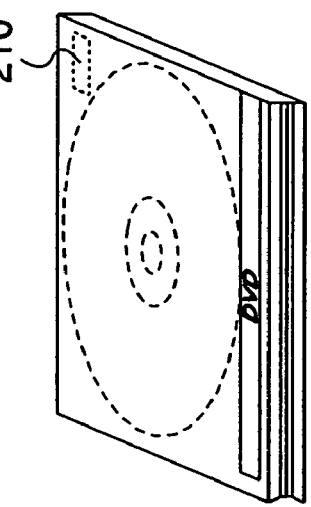

An IC chip manufactured using a laminating system according to the invention is in wide use. For example, IC chips can be used in paper money, coin, securities, bearer bonds, a certificate (such as a driver's license or a resident's card (FIG. 10A)), a packing case (such as a wrapper or a bottle (FIG. 10B)), a storage medium (such as a DVD or a video tape (FIG. 10C)), a vehicle (such as a bicycle (FIG. 10D)), personal belongings (such as a bag or glasses (FIG. 10E)), food, clothing, commodities, an electronic device, and the like. The electronic device includes a liquid crystal display device, an EL display device, a television device (also referred to as TV or a television receiver), a cellular phone, and the like.

An IC chip is fixed to an article by attaching it to the surface of the article, embedding it in the article, or the like. For example, an IC chip may be embedded in paper of a book, or in an organic resin of a package formed of an organic resin. Providing an IC chip for paper money, coin, securities, bearer bonds, a certificate, or the like can prevent forgery. Further, providing an IC chip for a packing case, a storage medium, personal belongings, foods, commodities, or an electronic device can improve efficiency of an inspection system, a system for a rental shop, or the like. Providing an IC chip for a vehicle can prevent forgery or robbery.

Figure 11B:
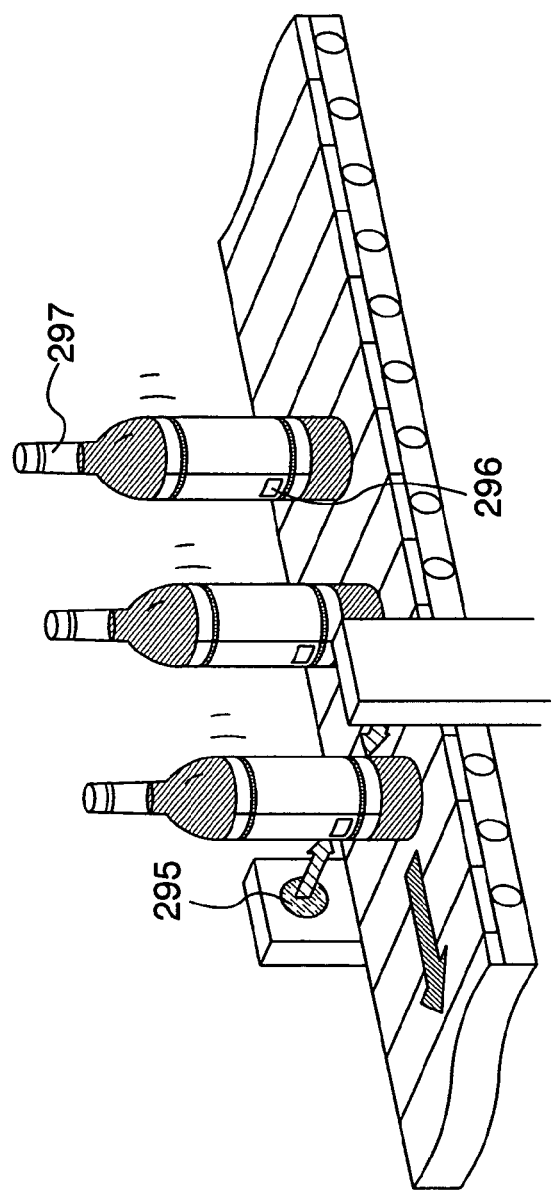
FIGS. 11A and 11B are figures showing usage patterns of IC chips.
Figure 11A:
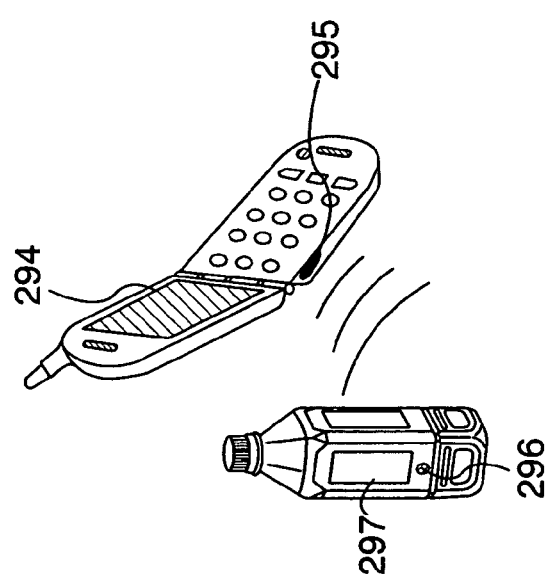

Further, IC chips may be applied to a system of commodity management and commodity distribution, thereby improving the functionality of the system. For example, a side surface of a portable terminal including a display area 294 is provided with a reader/writer 295, and a side surface of an article 297 is provided with an IC chip 296 (FIG. 11A). In this case, when the IC chip 296 is held over the reader/writer 295, information of the article 297 such as the raw materials, the place of origin, the history of distribution, or the like is displayed on the display area 294. As an alternative, a reader/writer 305 can be provided at the side of a conveyer belt (FIG. 11B). In this case, an article 397 can be easily checked using an IC chip 306 provided on a side surface of the article 397.

What is claimed is:
1. A laminating system comprising:
   transferring means configured to transfer a first substrate provided with a plurality of thin film integrated circuits;
   supplying means configured to supply a thermoplastic resin over the first substrate while being extruded in a heated and melted state;
   a roller having a cooling means, which attaches one surface of the thin film integrated circuits to a second substrate formed from the thermoplastic resin and separates the thin film integrated circuits from the first substrate by cooling the thermoplastic resin supplied in a heated and melted state;
   a supplying roller wound with a third substrate;
   sealing means configured to seal the thin film integrated circuits separated from the first substrate between the second substrate and the third substrate; and
   a receiving roller to be wound with the sealed thin film integrated circuits,
   wherein the transferring means is separately disposed from the roller having the cooling means.

2. A laminating system according to claim 1, wherein each of the second substrate and the third substrate is a laminate film.

3. A laminating system according to claim 1, wherein the sealing means includes a first roller and a second roller which are opposed to each other.

4. A laminating system according to claim 1, wherein the sealing means includes a first roller and a second roller which are opposed to each other, and at least one of the first roller and the second roller has at least one of a heating means and a cooling means.

5. A laminating system according to claim 1, wherein the sealing means seals the thin film integrated circuits by performing either or both of pressure treatment and heat treatment while the thin film integrated circuits pass between a first roller and a second roller which are opposed to each other.

6. A laminating system comprising:
supplying means configured to supply a thermoplastic resin over a first substrate provided with a plurality of thin film integrated circuits while being extruded in a heated and melted state;
a roller having a cooling means, which attaches one surface of the thin film integrated circuits to a second substrate formed from the thermoplastic resin and separates the thin film integrated circuits from the first substrate by cooling the thermoplastic resin supplied in a heated and melted state;
a supplying roller wound with a third substrate;
means for sealing the thin film integrated circuits separated from the first substrate between the second substrate and the third substrate; and
a receiving roller to be wound with the sealed thin film integrated circuits,
wherein the transferring means is separately disposed from the roller having the cooling means.

7. A laminating system according to claim 6, wherein each of the second substrate and the third substrate is a laminate film.

8. A laminating system according to claim 6, wherein the sealing means includes a first roller and a second roller which are opposed to each other.

9. A laminating system according to claim 6, wherein the sealing means includes a first roller and a second roller which are opposed to each other, and at least one of the first roller and the second roller has at least one of a heating means and a cooling means.

10. A laminating system according to claim 6, wherein the sealing means seals the thin film integrated circuits by performing either or both of pressure treatment and heat treatment while the thin film integrated circuits pass between a first roller and a second roller which are opposed to each other.

11. A laminating system comprising:
transferring means configured to transfer a first substrate provided with a plurality of thin film integrated circuits;
supplying means configured to supply a thermoplastic resin over the first substrate while being extruded in a heated and melted state;
a supplying roller wound with a third substrate;
sealing means configured to cool the thermoplastic resin supplied in a heated and melted state and to attach one surface of the thin film integrated circuits to a second substrate formed from the thermoplastic resin wherein the sealing means is configured to separate the thin film integrated circuits from the first substrate and to seal the thin film integrated circuits separated from the first substrate between the second substrate and the third substrate; and
a receiving roller to be wound with the sealed thin film integrated circuits.

12. A laminating system according to claim 11, wherein each of the second substrate and the third substrate is a laminate film.

13. A laminating system according to claim 11, wherein the sealing means includes a first roller and a second roller which are opposed to each other.

14. A laminating system according to claim 11, wherein the sealing means includes a first roller and a second roller which are opposed to each other, and at least one of the first roller and the second roller has at least one of a heating means and a cooling means.

15. A laminating system according to claim 11, wherein the sealing means seals the thin film integrated circuits by performing either or both of pressure treatment and heat treatment while the thin film integrated circuits pass between a first roller and a second roller which are opposed to each other.

16. A laminating system comprising:
a first substrate provided with a plurality of thin film integrated circuits;
a supplying roller wound with a second substrate;
transferring means configured to transfer the second substrate;
placing means configured to place the first substrate above the second substrate so that one surface of the thin film integrated circuits provided over the first substrate is attached to the second substrate;
separating means configured to separate the thin film integrated circuits from the first substrate by attaching the one surface of the thin film integrated circuits to the second substrate;
supplying means configured to supply a thermoplastic resin in a heated and melted state;
sealing means configured to seal the thin film integrated circuits separated from the first substrate between the second substrate and a third substrate formed from the thermoplastic resin; and
a receiving roller to be wound with the sealed thin film integrated circuits,
wherein the placing means is separately disposed from the separating means.

17. A laminating system according to claim 16, wherein each of the second substrate and the third substrate is a laminate film.

18. A laminating system according to claim 16, wherein the sealing means includes a first roller and a second roller which are opposed to each other.

19. A laminating system according to claim 16, wherein the sealing means includes a first roller and a second roller which are opposed to each other, and one of the first roller and the second roller has at least one of a heating means and a cooling means.

20. A laminating system according to claim 16, wherein the sealing means seals the thin film integrated circuits by performing either or both of pressure treatment and heat treatment while the thin film integrated circuits pass between a first roller and a second roller which are opposed to each other.

21. A laminating system comprising:
transferring means configured to transfer a first substrate provided with a plurality of thin film integrated circuits;

a die for supplying a thermoplastic resin over the first substrate;

a roller which attaches one surface of the thin film integrated circuits to a second substrate formed from the thermoplastic resin and separates the thin film integrated circuits from the first substrate by cooling the thermoplastic resin;

a supplying roller wound with a third substrate;

sealing means configured to seal the thin film integrated circuits separated from the first substrate between the second substrate and the third substrate; and a receiving roller to be wound with the sealed thin film integrated circuits, wherein the transferring means is separately disposed from the roller.

22. A laminating system according to claim 21, wherein each of the second substrate and the third substrate is a laminate film.

23. A laminating system according to claim 21, wherein the sealing means includes a first roller and a second roller which are opposed to each other.

24. A laminating system according to claim 21, wherein the sealing means includes a first roller and a second roller which are opposed to each other, and at least one of the first roller and the second roller has at least one of a heating means and a cooling means.

25. A laminating system according to claim 21, wherein the sealing means seals the thin film integrated circuits by performing either or both of pressure treatment and heat treatment while the thin film integrated circuits pass between a first roller and a second roller which are opposed to each other.

* * * * *